(12) United States Patent
Baek et al.

(10) Patent No.: US 12,156,452 B2
(45) Date of Patent: Nov. 26, 2024

(54) DISPLAY DEVICE

(71) Applicant: Samsung Display Co., LTD., Yongin-si (KR)

(72) Inventors: Moonjung Baek, Seoul (KR); Youngmin Kim, Asan-si (KR); Hyunwoo Noh, Yongin-si (KR); Keunyoung Park, Suwon-si (KR); Kwangkeun Lee, Osan-si (KR); Junhan Lee, Seoul (KR); Suji Han, Seoul (KR)

(73) Assignee: SAMSUNG DISPLAY CO., LTD., Gyeonggi-Do (KR)

(*) Notice: Subject to any disclaimer, the term of this patent is extended or adjusted under 35 U.S.C. 154(b) by 455 days.

(21) Appl. No.: 17/400,294

(22) Filed: Aug. 12, 2021

(65) Prior Publication Data
US 2022/0157893 A1    May 19, 2022

(30) Foreign Application Priority Data
Nov. 13, 2020   (KR) .................. 10-2020-0151609

(51) Int. Cl.
*H10K 59/38*     (2023.01)
*H10K 50/858*    (2023.01)
(Continued)

(52) U.S. Cl.
CPC ........... *H10K 59/38* (2023.02); *H10K 50/858* (2023.02); *H10K 50/8426* (2023.02); *H10K 59/122* (2023.02)

(58) Field of Classification Search
CPC .. H10K 59/38; H10K 50/858; H10K 50/8426; H10K 59/122; H10K 50/865;
(Continued)

(56) References Cited

U.S. PATENT DOCUMENTS

| | | |
|---|---|---|
| 7,759,864 B2 | 7/2010 | Lee et al. |
| 2011/0084290 A1 | 4/2011 | Nakamura et al. |

(Continued)

FOREIGN PATENT DOCUMENTS

| | | |
|---|---|---|
| KR | 20070118429 A | 12/2007 |
| KR | 10-1600222 B1 | 3/2016 |

(Continued)

OTHER PUBLICATIONS

European Search Report for European Patent Application No. 21192011.1 dated Feb. 10, 2022.

(Continued)

*Primary Examiner* — Syed I Gheyas
(74) *Attorney, Agent, or Firm* — CANTOR COLBURN LLP

(57) ABSTRACT

A display device includes a lower panel including a display area and a peripheral area, an upper panel facing the lower panel and including a partition wall defining a plurality of openings in the display area, a first upper dam in the peripheral area and spaced apart from the partition wall and a first opening defined between the partition wall and the first upper dam, and a filling member which is in the display area between the lower panel and the upper panel and extends from the display area and into the first opening defined between the partition wall and the first upper dam.

27 Claims, 17 Drawing Sheets

(51) Int. Cl.
*H10K 50/842* (2023.01)
*H10K 59/122* (2023.01)

(58) Field of Classification Search
CPC ...... H10K 59/88; H10K 50/841; H10K 59/12; H10K 50/8428; H10K 50/844; H10K 59/124
See application file for complete search history.

(56) References Cited

U.S. PATENT DOCUMENTS

| | | | |
|---|---|---|---|
| 2016/0064686 A1* | 3/2016 | Odaka | H10K 50/8426 257/89 |
| 2019/0206960 A1* | 7/2019 | Lee | H10K 50/8426 |
| 2020/0136074 A1 | 4/2020 | Lee et al. | |
| 2021/0091333 A1* | 3/2021 | Park | H10K 59/124 |

FOREIGN PATENT DOCUMENTS

| | | |
|---|---|---|
| KR | 20180054386 A | 5/2018 |
| KR | 1020200024979 A | 3/2020 |
| KR | 1020200113077 A | 10/2020 |

OTHER PUBLICATIONS

Office Action dated Nov. 24, 2023 issued in corresponding European Patent Application No. 21192011.1, 6 pp.

* cited by examiner

DISPLAY DEVICE

This application claims priority to Korean Patent Application No. 10-2020-0151609, filed on Nov. 13, 2020, and all the benefits accruing therefrom under 35 U.S.C. § 119, which is hereby incorporated by reference for all purposes as if fully set forth herein.

BACKGROUND

1. Field

Embodiments relate to a display device. More particularly, embodiments relate to a display device including an upper panel, a lower panel and a filling member disposed between the upper panel and the lower panel.

2. Description of the Related Art

Flat panel display devices are replacing cathode ray tube display devices as display devices due to lightweight and thin characteristics. As representative examples of such flat panel display devices, there are liquid crystal display devices and organic light emitting diode display devices.

The flat panel display device may include a lower panel and an upper panel which is combined with the lower panel. Pixels may be disposed in the lower panel, and color conversion parts may be disposed in the upper panel. The flat panel display device may have a display area in which an image is displayed and a peripheral area which surrounds the display area. A sealing member may be disposed in the peripheral area between the upper panel and the lower panel. A filling member to function as a buffer against external pressure may be disposed in the display area between the upper panel and the lower panel.

SUMMARY

Embodiments provide a display device with improved reliability.

Additional features will be set forth in the description which follows, and in part will be apparent from the description, or may be learned by practice of the invention.

An embodiment of a display device includes a lower panel including a display area and a peripheral area which is adjacent to the display area, an upper panel facing the lower panel, and a filling member in the display area between the lower panel and the upper panel. The lower panel includes a lower substrate including the display area and the peripheral area. The upper panel includes an upper substrate facing the lower substrate, a partition wall in the display area under the upper substrate and defining a plurality of openings, and a first upper dam in the peripheral area under the upper substrate and spaced apart from the partition wall. The filling member in the display area between the lower substrate and the upper substrate is partially positioned in a first opening defined between the partition wall and the first upper dam.

In an embodiment, the upper panel may further include color conversion parts in corresponding ones of the plurality of openings of the partition wall, respectively.

In an embodiment, the first upper dam may be spaced apart from the partition wall and surround the partition wall.

In an embodiment, the partition wall may include an organic material. The first upper dam may include substantially the same material as the partition wall.

In an embodiment, the upper panel may further include a first passivation layer covering the partition wall and the first upper dam under the upper substrate and including an inorganic material.

In an embodiment, the upper panel may further include an organic layer in the peripheral area between the upper substrate and the first upper dam and overlapping the first upper dam.

In an embodiment, the organic layer may overlap the first opening.

In an embodiment, the organic layer may not overlap the first opening.

In an embodiment, the upper panel may further include color filter layers in the display area between the upper substrate and the partition wall. The organic layer may include substantially the same material as at least one of the color filter layers.

In an embodiment, the upper panel may further include a second passivation layer covering the color filter layers and the organic layer under the upper substrate and including an inorganic material.

In an embodiment, the upper panel may further include a light blocking layer in the display area between the upper substrate and the partition wall. The organic layer may include substantially the same material as the light blocking layer.

In an embodiment, the upper panel may further include a low refractive layer in the display area between the upper substrate and the partition wall. The organic layer may include substantially the same material as the low refractive layer.

In an embodiment, the organic layer may have a multi-layered structure including a plurality of layers including different materials.

In an embodiment, at least one of the plurality of layers may overlap the first opening, and at least one of the plurality of layers may not overlap the first opening.

In an embodiment, the lower panel may further include a first lower dam in the peripheral area on the lower substrate and overlapping the first upper dam.

In an embodiment, the first upper dam is positioned on the first lower dam and may be spaced apart from the first lower dam.

In an embodiment, the lower panel may further include a second lower dam in the peripheral area on the lower substrate and spaced apart from the display area with the first lower dam therebetween.

In an embodiment, the first upper dam may overlap the first lower dam and the second lower dam.

In an embodiment, the upper panel may further include a second upper dam in the peripheral area under the upper substrate, spaced apart from the first upper dam and overlapping the second lower dam. A second opening may be defined between the first upper dam and the second upper dam.

In an embodiment, the second upper dam may be spaced apart from the first upper dam and surrounds the first upper dam.

In an embodiment, the filling member may be partially positioned in the second opening.

In an embodiment, the upper panel may further include an organic layer in the peripheral area between the upper substrate and the second upper dam and overlapping the second upper dam.

In an embodiment, the organic layer may overlap the first upper dam, the first opening and the second opening.

In an embodiment, the organic layer may not overlap the second opening.

In an embodiment, the lower panel may further include a driving element in the display area on the lower substrate, a light emitting element on the driving element and including a pixel electrode electrically connected to the driving element, a counter electrode corresponding to the pixel electrode and an emission layer between the pixel electrode and the counter electrode, a planarization layer between the driving element and the light emitting element and including an organic material, and a pixel defining layer between the planarization layer and the counter electrode and including an organic material. The first lower dam may include a first layer including substantially the same material as the planarization layer and a second layer on the first layer and including substantially the same material as the pixel defining layer.

In an embodiment, the display device may further include a sealing member in the peripheral area between the upper substrate and the lower substrate.

In an embodiment, the sealing member may be spaced apart from the partition wall with the first upper dam therebetween.

One or more embodiments of the display device may include the lower panel, the upper panel combined with the lower panel, and the filling member in the display area between the lower panel and the upper panel. The upper panel may include the partition wall and the upper dam. The partition wall may be in the display area under the upper substrate. The upper dam may be in the peripheral area under the upper substrate and may be spaced apart from the partition wall. The opening may be between the partition wall and the upper dam. The opening may accommodate a portion of the filling member extending to the peripheral area. Accordingly, the upper dam may control a width of the portion of the filling member positioned in the peripheral area. Accordingly, the reliability of the display device may be improved.

One or more embodiment of the display device may further include the lower dam overlapping the upper dam. The upper dam may overlap the lower dam so that the upper dam may contribute to maintaining a gap in the peripheral area between the lower panel and the upper panel. Accordingly, the reliability of the display device may be improved.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the invention.

DETAILED DESCRIPTION

Figure 1:
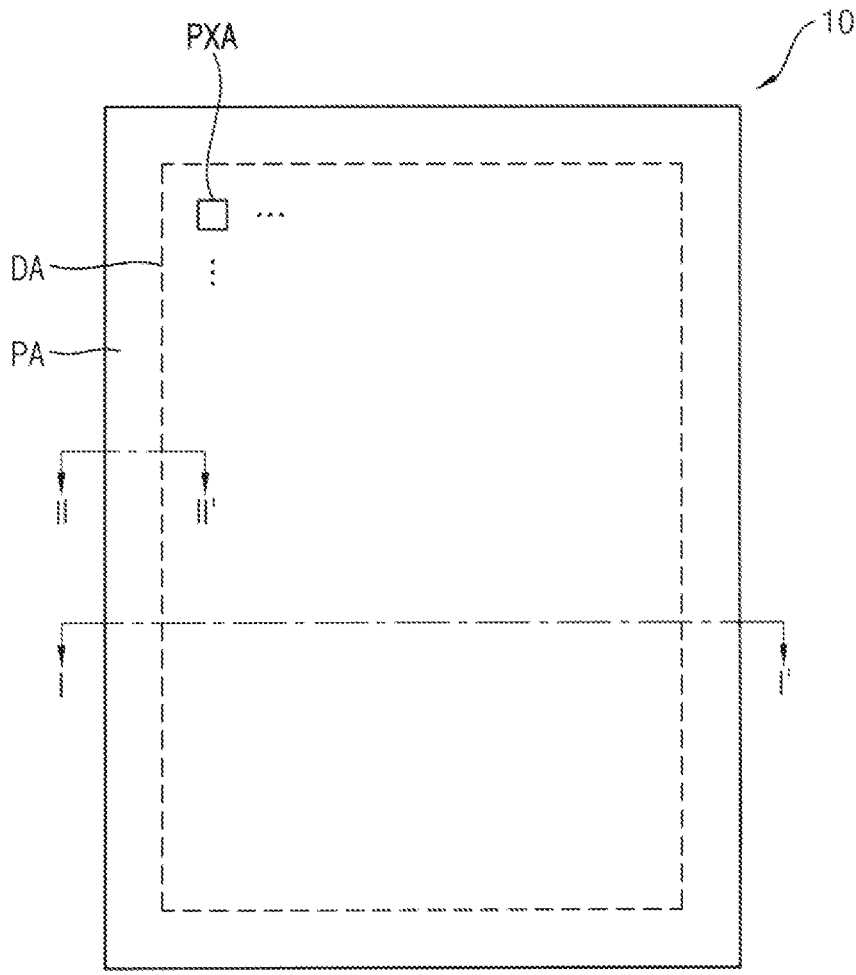
FIG. 1 is a plan view illustrating an embodiment of a display device.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being related to another element such as being "on" another element, it can be directly on the other element or intervening elements may be present therebetween. In contrast, when an element is referred to as being related to another element such as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Illustrative, non-limiting embodiments will be more clearly understood from the following detailed description in conjunction with the accompanying drawings.

Figure 2:
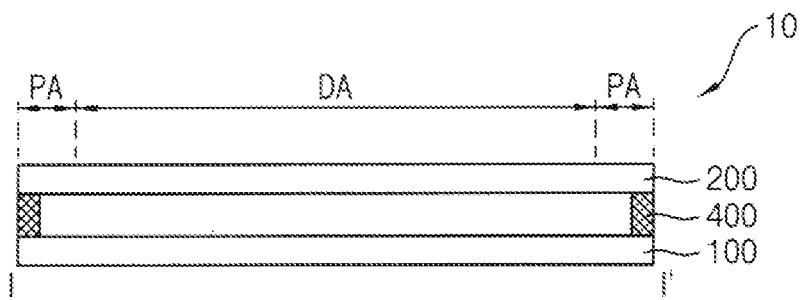
FIG. 2 is a cross-sectional view taken along line I-I' of FIG. 2.

FIG. 1 is a plan view illustrating an embodiment of a display device 10. FIG. 2 is a cross-sectional view taken along line I-I' of FIG. 2.

Referring to FIGS. 1 and 2, a display device 10 may include a lower panel 100, an upper panel 200 and a sealing member 400. The lower panel 100 and the upper panel 200 may be combined with each other by the sealing member 400. The upper panel 200 faces the lower panel 100 along a thickness direction.

The display device 10 may include (e.g., have) a display area DA and a peripheral area PA which is adjacent to the display area DA. An image may be displayed in the display area DA. The display area DA may include a pixel area PXA provided in plural including a plurality of pixel areas PXA. In an embodiment, the peripheral area PA may extend along or be around (e.g., surround) the display area DA in a plan view. Various components and layers of the display device 10, for example, each of the lower panel 100 and the upper panel 200, may include (e.g., have) the display area DA and the peripheral area PA corresponding to those described above for the display device 10.

The display device 10 and various components and layers thereof may be disposed in a plane defined by a first direction and a second direction which crosses the first direction. Referring to FIG. 1, the vertical and horizontal directions may variously represent the first direction and the second direction without being limited thereto. A thickness direction of the display device 10 and various components and layers thereof may extend along a third direction crossing each of the first direction and the second direction. Referring to FIG. 2, for example, the vertical direction may represent the third direction, which the horizontal direction may variously represent the first direction and the second direction without being limited thereto. A plan view may be a view along the third direction (e.g., along a thickness direction).

The lower panel 100 may be a display panel including a plurality of pixels which are controlled or driven to generate an image. The pixels may be disposed in the display area DA in the lower panel 100. Each of the pixels may include a light emitting element 160 which generates and/or emits a light and a driving element TR which is connected to the light emitting element 160 to drive the light emitting element 160. In an embodiment, for example, the light emitting element 160 may include an organic light emitting diode. In an embodiment, the light emitting element 160 may include a nano light emitting diode. The driving element TR may include a switching element such as a thin film transistor.

The upper panel 200 may be a color conversion panel including color conversion parts. In an embodiment, for example, the color conversion parts may be disposed in the display area DA in the upper panel 200 and may convert a wavelength of the light generated by the light emitting element 160 included in the lower panel 100. In an embodiment, for example, the upper panel 200 may further include color filter layers which transmit a light having a specific color (e.g., a light having a specific wavelength range).

The lower panel 100 and the upper panel 200 may be combined with each other by the sealing member 400. The sealing member 400 may be disposed in the peripheral area PA which is between the lower panel 100 and the upper panel 200. In an embodiment, for example, the sealing member 400 may not be disposed in the display area DA (e.g., may be excluded from the display area DA or spaced apart from the display area DA), but may be disposed in the peripheral area PA between the lower panel 100 and the upper panel 200 to surround the display area DA.

In a plan view, for example, the sealing member 400 may have a hollow rectangular shape (e.g., a rectangular frame shape). However, embodiments are not limited thereto, and the sealing member 400 may have various planar shapes corresponding to a planar shape of the lower panel 100 and/or the upper panel 200. In an embodiment, for example, when the lower panel 100 and/or the upper panel 200 has a planar shape such as a triangle, a rhombus, a polygon, a circle, an oval or the like, the sealing member 400 may have a corresponding planar shape of a hollow triangle, a hollow rhombus, a hollow polygon, a hollow circle, a hollow oval or the like in a plan view.

In an embodiment, for example, the sealing member 400 may include a frit or the like. In an embodiment, the sealing member 400 may include a photocurable resin such as an epoxy acrylate resin, a polyester acrylate resin, a urethane acrylate resin, a polybutadiene acrylate resin, a silicone acrylate resin, an alkyl acrylate resin and/or the like. In an embodiment of providing the display device 10, for example, a laser may be irradiated to a sealing member material of the sealing member 400 which is disposed between the lower panel 100 and the upper panel 200. The sealing member material of the sealing member 400 may be cured by the laser to combine the lower panel 100 and the upper panel 200 by the sealing member 400.

A filling member 300 (of FIG. 3) may be disposed in the display area DA between the lower panel 100 and the upper panel 200. In an embodiment, for example, the filling member 300 may function as a buffer against external pressure applied to the display device 10 (e.g., impact resistant layer). In an embodiment, for example, the filling member 300 may maintain a gap between the lower panel 100 and the upper panel 200 which is along the thickness direction. In an embodiment, for example, the filling member 300 which is in the display area DA may extend from the display area DA to the peripheral area PA so that a portion of the filling member 300 may be positioned in the peripheral area PA between the lower panel 100 and the upper panel 200. This will be described in detail later. The filling member 300 may fill an entirety of the gap defined between the lower panel 100 and the upper panel 200, without being limited thereto.

In an embodiment, the filling member 300 may include a material which transmits light (e.g., light transmitting material). In an embodiment, for example, the filling member may include an organic material such as a silicone resin, an epoxy resin, an epoxy-acrylic resin and/or the like. In an embodiment, for example, the filling member may include an appropriate and/or suitable material for matching a refractive index of one or more component or layer within the display device 10.

Figure 3:
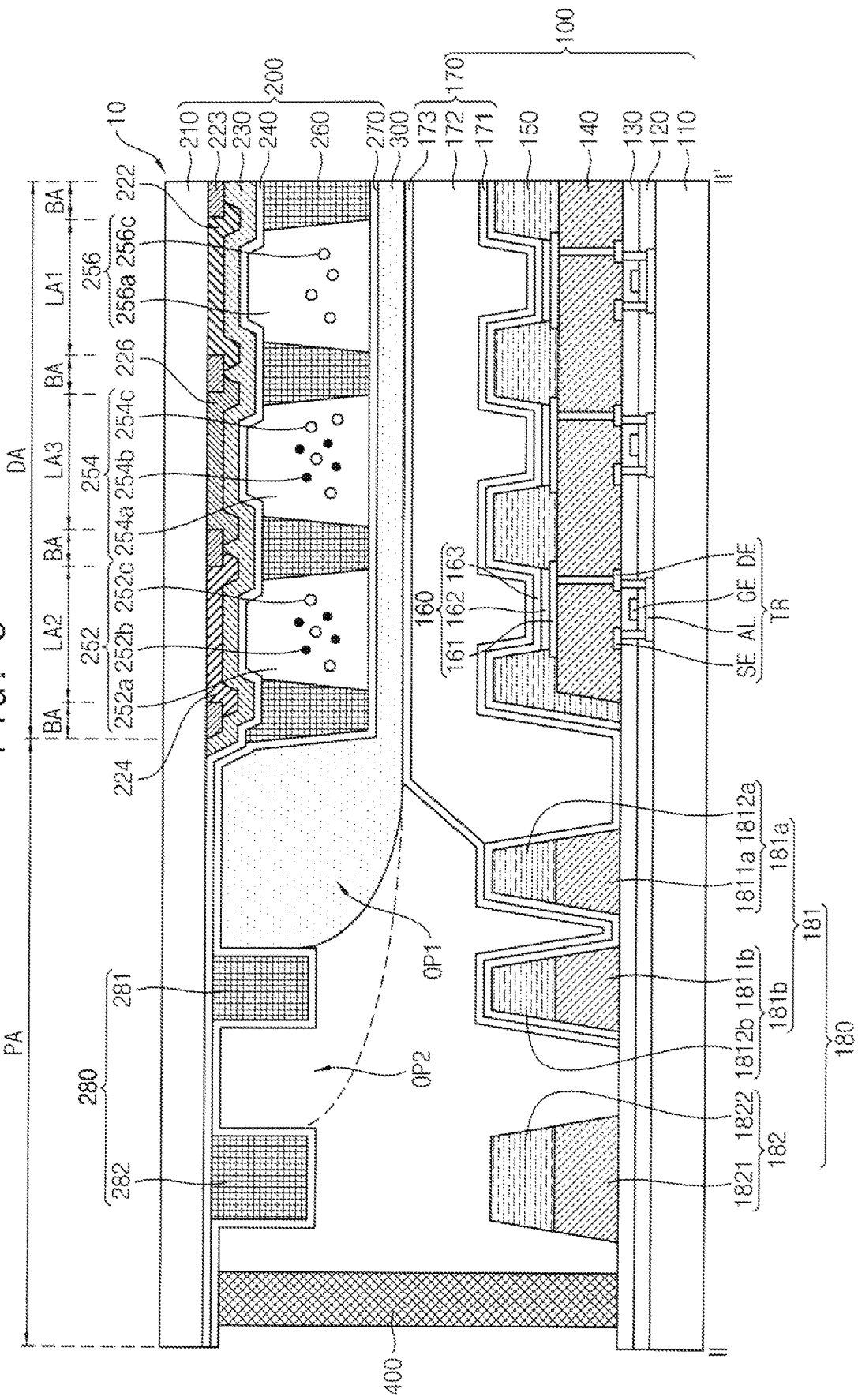
FIG. 3 is a cross-sectional view illustrating an embodiment of the display device taken along line II-II' of FIG. 1.
Figure 4:
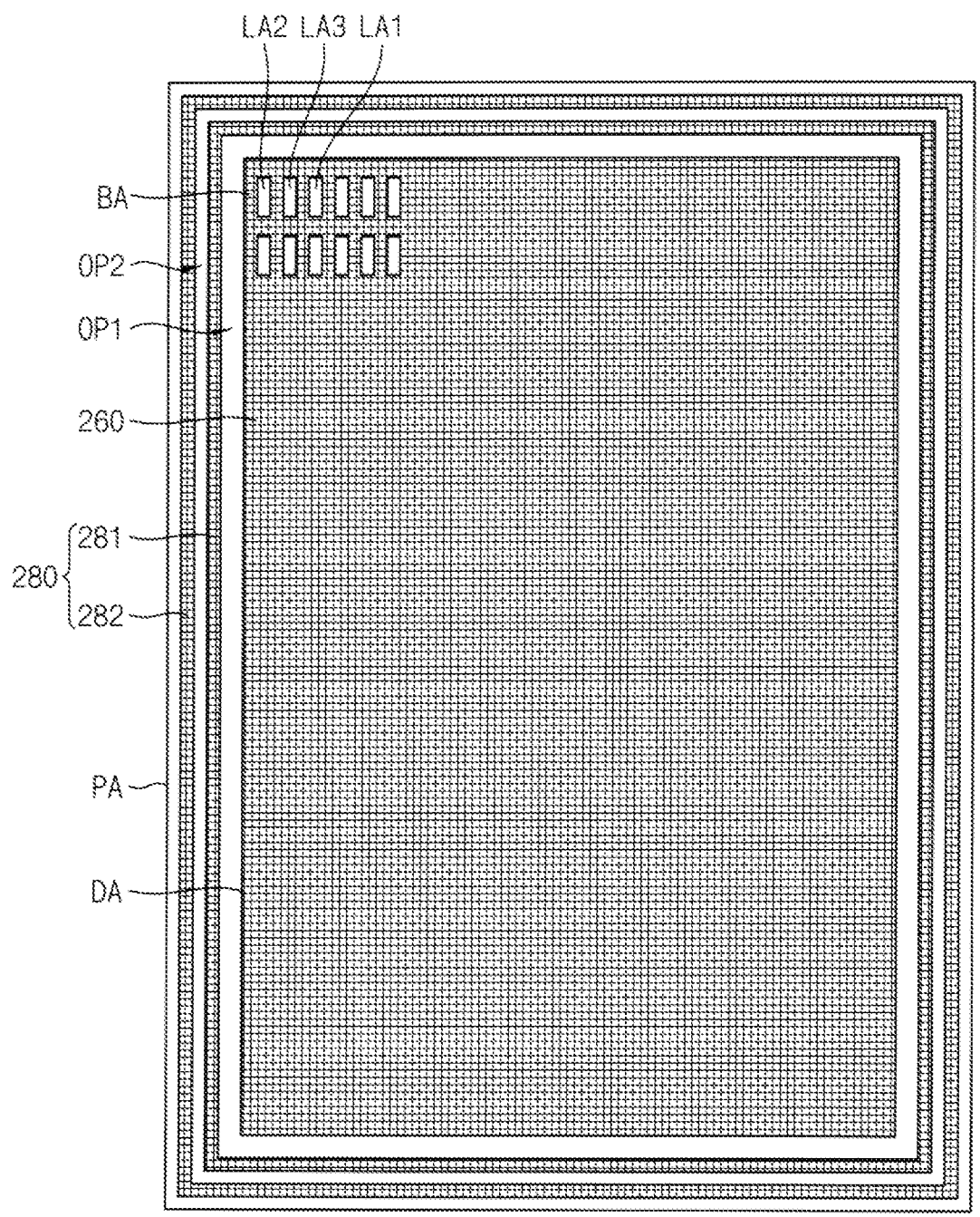
FIG. 4 is a plan view illustrating an embodiment of a partition wall and an upper dam included in the display device of FIG. 3.

FIG. 3 is a cross-sectional view taken along line II-II' of FIG. 1. FIG. 4 is a plan view illustrating an embodiment of a partition wall and an upper dam included in the display device 10 of FIG. 3.

Referring to FIGS. 3 and 4, the display device 10 may include the lower panel 100, the upper panel 200, the filling member 300 and the sealing member 400. The lower panel 100 may include a lower substrate 110, a gate insulating layer 120, an interlayer insulating layer 130, a planarization layer 140, a pixel defining layer 150, a driving element TR, a light emitting element 160, an encapsulation layer 170, and a lower dam 180. The driving element TR may include an active layer AL, a gate electrode GE, a source electrode SE and a drain electrode DE. The light emitting element 160 may include a pixel electrode 161, an emission layer 162 and a counter electrode 163.

The lower substrate 110 may define or include (e.g., have) the display area DA and the peripheral area PA. The lower substrate 110 may be a transparent insulating substrate. In an embodiment, for example, the lower substrate 110 may include glass, quartz, plastic, or the like.

The active layer AL may be disposed in the display area DA, on the lower substrate 110. In an embodiment, for example, the active layer AL may include or be formed of amorphous silicon, polycrystalline silicon, oxide semiconductor or the like. The active layer AL may include a source area and a drain area each doped with impurities, and a channel area which is disposed between the source area and the drain area.

Although not illustrated in the drawing, a buffer layer may be disposed between the lower substrate 110 and the active layer AL. The buffer layer may prevent or reduce penetration of foreign substances from the lower substrate 110 into a component or layer above the buffer layer. In an embodiment, for example, the buffer layer may include an inorganic insulating material such as silicon oxide, silicon nitride, silicon oxynitride, and/or the like.

The gate insulating layer 120 may be disposed on the lower substrate 110. In an embodiment, for example, the gate insulating layer 120 may be disposed in an entirety of the display area DA and an entirety of the peripheral area PA, on the lower substrate 110. A portion of the gate insulating layer 120 disposed in the display area DA may cover the active layer AL, on the lower substrate 110. In an embodiment, for example, the gate insulating layer 120 may include an inorganic insulating material such as silicon oxide, silicon nitride, silicon oxynitride and/or the like.

The gate electrode GE may be disposed in the display area DA, on the gate insulating layer 120. The gate electrode GE may overlap the channel area of the active layer AL. The gate electrode GE may include a metal, an alloy, a conductive metal oxide, a conductive metal nitride, a transparent conductive material and/or the like. In an embodiment, for example, the gate electrode GE may include molybdenum (Mo), copper (Cu) and/or the like.

The interlayer insulating layer 130 may be disposed on the gate insulating layer 120. In an embodiment, for example, the interlayer insulating layer 130 may be disposed in an entirety of the display area DA and an entirety of the peripheral area PA, on the gate insulating layer 120. A portion of the interlayer insulating layer 130 disposed in the display area DA may cover the gate electrode GE on the gate insulating layer 120. In an embodiment, for example, the interlayer insulating layer 130 may include an inorganic insulating material such as silicon oxide, silicon nitride, silicon oxynitride and/or the like.

The source electrode SE and the drain electrode DE may be disposed in the display area DA, on the interlayer insulating layer 130. The source electrode SE and the drain electrode DE may be electrically connected to the source area and the drain area of the active layer AL, respectively. Each of the source electrode SE and the drain electrode DE may include a metal, an alloy, a conductive metal oxide, a conductive metal nitride, a transparent conductive material and/or the like. In an embodiment, for example, each of the source electrode SE and the drain electrode DE may include at least one of aluminum (Al), titanium (Ti), copper (Cu) and/or the like. The active layer AL, the gate electrode GE, the source electrode SE and the drain electrode DE may together form the driving element TR.

The planarization layer 140 may be disposed in the display area DA, on the interlayer insulating layer 130. The planarization layer 140 may cover the source electrode SE and the drain electrode DE, on the interlayer insulating layer 130. The planarization layer 140 may have a substantially flat upper surface (e.g., without a stepped portion corresponding to the source electrode SE and the drain electrode DE). In an embodiment, for example, the planarization layer 140 may include an organic insulating material such as polyimide ("PI") or the like. In an embodiment, for example, the planarization layer 140 may have a multi-layered structure including a lower layer including an inorganic insulating material and an upper layer including an organic insulating material.

The pixel electrode 161 may be disposed in the display area DA, on the planarization layer 140. The pixel electrode 161 may be electrically connected to the source electrode SE or the drain electrode DE. That is, the pixel electrode 161 may be disposed on the driving element TR, and may be electrically connected to the driving element TR. The pixel electrode 161 may include a metal, an alloy, a conductive metal oxide, a conductive metal nitride, a transparent conductive material and/or the like. In an embodiment, for example, the pixel electrode 161 may include silver (Ag), indium tin oxide ("ITO") and/or the like.

The pixel defining layer 150 may be disposed in the display area DA, on the planarization layer 140. The pixel defining layer 150 may partially cover the pixel electrode 161 on the planarization layer 140. The pixel defining layer 150 may define a pixel opening which exposes a portion of the pixel electrode 161 to outside the pixel defining layer 150. In an embodiment, for example, the pixel opening may expose a central portion of the pixel electrode 161, and the pixel defining layer 150 may cover a peripheral portion (e.g., edge) of the pixel electrode 161. The pixel defining layer 150 may include an organic insulating material such as polyimide ("PI") or the like.

The emission layer 162 may be disposed on the pixel electrode 161 which is exposed by the pixel opening of the pixel defining layer 150. That is, the emission layer 162 may be disposed in the pixel opening. The emission layer 162 may be disposed between the pixel electrode 161 and the counter electrode 163. That is, the pixel electrode 161 and the counter electrode 163 may face each other with the emission layer 162 therebetween. The emission layer 162 may include at least one of an organic light emitting material and a quantum dot.

In an embodiment, the organic light emitting material may include a low molecular organic compound or a high molecular organic compound. The low molecular organic compound may include at least one of copper phthalocyanine, N,N'-diphenylbenzidine, tris-(8-hydroxyquinoline)aluminum and/or the like, and the high molecular organic compound may include at least one of poly(3,4-ethylenedioxythiophene), polyaniline, poly(p-phenylene vinylene), polyfluorene and/or the like.

The counter electrode 163 may be disposed on the emission layer 162 and may correspond to the pixel electrode 161. In an embodiment, the counter electrode 163 may also be disposed on the pixel defining layer 150. That is, the counter electrode 163 may extend from the emission layer 162 in the pixel opening, along a sidewall of the pixel defining layer 150 which defines the pixel opening and along an upper surface of the pixel defining layer 150, without being limited thereto. The counter electrode 163 may include a metal, an alloy, a conductive metal oxide, a conductive metal nitride, a transparent conductive material and/or the like. In an embodiment, for example, the counter electrode 163 may include aluminum (Al), platinum (Pt), silver (Ag), magnesium (Mg), gold (Au), chromium (Cr), tungsten (W), titanium (Ti) and/or the like. The pixel electrode 161, the emission layer 162 and the counter electrode 163 may together form the light emitting element 160.

The encapsulation layer 170 may be disposed on the counter electrode 163. The encapsulation layer 170 may cover the light emitting element 160. The encapsulation layer 170 may encapsulate the display area DA to protect the light emitting element 160 from external impurities.

The encapsulation layer 170 may include at least one inorganic encapsulation layer and at least one organic encapsulation layer. In an embodiment, the encapsulation layer 170 may include a first inorganic encapsulation layer 171, a second inorganic encapsulation layer 173 which faces the first inorganic encapsulation layer 171, and an organic encapsulation layer 172 disposed between the first inorganic encapsulation layer 171 and the second inorganic encapsulation layer 173.

The first inorganic encapsulation layer 171 may be disposed on the counter electrode 163. In an embodiment, for example, the first inorganic encapsulation layer 171 may have a substantially uniform thickness along the profile of the counter electrode 163. The first inorganic encapsulation layer thickness may be taken in a direction normal to the profile of the counter electrode 163.

The organic encapsulation layer 172 may be disposed on the first inorganic encapsulation layer 171. The organic encapsulation layer 172 may have a substantially flat upper surface without a step corresponding to a profile of the first inorganic encapsulation layer 171.

The second inorganic encapsulation layer 173 may be disposed on the organic encapsulation layer 172. The second inorganic encapsulation layer 173 may have a substantially uniform thickness and may have a substantially flat upper surface.

The lower dam 180 may be disposed in the peripheral area PA, on the lower substrate 110. In an embodiment, for example, the lower dam 180 may be disposed in the peripheral area PA, on the interlayer insulating layer 130.

In an embodiment, the lower dam 180 may include a plurality of dams (e.g., dam patterns) including a first lower dam 181 and a second lower dam 182. In an embodiment, for example, the first lower dam 181 may include a first sub-dam 181a and a second sub-dam 181b. The first lower dam 181 may be closer to the display area DA than the second lower dam 182.

The first sub-dam 181a may be extended around (e.g., surround) the display area DA in a plan view. The second sub-dam 181b may be spaced apart from the first sub-dam 181a in a direction along the lower substrate 110 and may be extended around (e.g., surround) the first sub-dam 181a in a plan view. The second sub-dam 181b may be further from the display area DA than the first sub-dam 181a.

In an embodiment, the first sub-dam 181a may include a first layer 1811a (e.g., first pattern) and a second layer 1812a (e.g., second pattern) which is disposed on the first layer 1811a. In an embodiment, for example, the first layer 1811a of the first sub-dam 181a may include substantially the same material as the planarization layer 140, and may be substantially simultaneously (or concurrently) provided or formed with the planarization layer 140. That is, the first layer 1811a of the first sub-dam 181a is in a same layer as the planarization layer 140. The second layer 1812a of the first sub-dam 181a may include substantially the same material as the pixel defining layer 150, and may be substantially simultaneously (or concurrently) provided or formed with the pixel defining layer 150. That is, the second layer 1812a of the first sub-dam 181a is in a same layer as the pixel defining layer 150. As being in a same layer, elements may be respective portions or patterns of a same material layer on the lower substrate 110.

In an embodiment, the second sub-dam 181b may include a first layer 1811b and a second layer 1812b which is disposed on the first layer 1811b. In an embodiment, for example, the first layer 1811b of the second sub-dam 181b may include substantially the same material as the planarization layer 140, and may be substantially simultaneously (or concurrently) provided or formed with the planarization layer 140. The second layer 1812b of the second sub-dam 181b may include substantially the same material as the pixel defining layer 150, and may be substantially simultaneously (or concurrently) provided or formed with the pixel defining layer 150.

In an embodiment, the first and second sub-dams 181a and 181b may further include third layers which are respectively disposed on the second layers 1812a and 1812b. In an embodiment, for example, the third layers may include substantially the same material as a spacer (not illustrated)

which is disposed on the pixel defining layer 150, and may be substantially simultaneously (or concurrently) provided or formed with the spacer.

In a method of providing a display device 10, for example, the first lower dam 181 may prevent or reduce overflowing of an organic material of the organic encapsulation layer 172 from the display area DA to outside of the first lower dam 181 which is in the peripheral area PA. (e.g., to the left side of the first lower dam 181 of FIG. 3). That is, an edge of the organic encapsulation layer 172 may be disposed on the first lower dam 181 (e.g., corresponding to or an inside of the first lower dam 181).

The second lower dam 182 may be spaced apart from the first lower dam 181 and may extended along or around (e.g., surround) the first lower dam 181. In an embodiment, for example, the second lower dam 182 may be spaced apart from the second sub-dam 181*b* and may extend along or around (e.g., surround) the second sub-dam 181*b*.

In an embodiment, the second lower dam 182 may include a first layer 1821 and a second layer 1822 which is disposed on the first layer 1821. In an embodiment, for example, the first layer 1821 of the second lower dam 182 may include substantially the same material as the planarization layer 140, and may be substantially simultaneously (or concurrently) provided or formed with the planarization layer 140. The second layer 1822 of the second lower dam 182 may include substantially the same material as the pixel defining layer 150 and may be substantially simultaneously (or concurrently) provided or formed with the pixel defining layer 150.

Taking FIGS. 3 and 4 together, portions of the lower dam 180 and the upper dam 280 may have a length extending along a respective outer edge of the display device 10 (e.g., length direction) and a width which is taken in a direction crossing the length direction such as a direction perpendicular thereto.

A method of providing a display device 10, for example, the second lower dam 182 may support a mask structure used for a mask process during a manufacturing process of the display device 10. In addition, the second lower dam 182 may function as a buffer when supporting the mask structure. In addition, the second lower dam 182 may prevent or reduce a transmission of cracks into the display area DA.

FIG. 3 illustrates that the first and second inorganic encapsulation layers 171 and 173 extend from the display area to cover the first lower dam 181 in the peripheral area PA and do not cover the second lower dam 182 (e.g., spaced apart from the second lower dam 182), but embodiments are not limited thereto. In embodiments, the first and second inorganic encapsulation layers 171 and 173 may extend from the display area DA entirely cover both of the first lower dam 181 and the second lower dam 182 in the peripheral area PA.

The upper panel 200 may include an upper substrate 210, a first color filter layer 222 (e.g., first color filter pattern), a second color filter layer 224 (e.g., second color filter pattern), a third color filter layer 226 (e.g., third color filter pattern) (e.g., first to third color filter layers 222, 224 and 226), a light blocking layer 223 (e.g., light blocking pattern), a low refractive layer 230, a first passivation layer 240, a partition wall 260, a first color conversion part 252 and a second color conversion part 254 (e.g., first and second color conversion parts 252 and 254), a transmission part 256, a second passivation layer 270 and an upper dam 280. The first color filter layer 222, the second color filter layer 224, and the third color filter layer 226 may together form a color filter layer. The first color conversion part 252, the second color conversion part 254 and the transmission part 256 may together provide a color conversion layer.

The upper substrate 210 may be disposed on the lower panel 100 and may face the lower substrate 110. In an embodiment, for example, the upper substrate 210 may include glass, quartz, plastic or the like.

In an embodiment, the upper substrate 210 may include a light emitting area and a light blocking area BA in the display area DA. In an embodiment, for example, each of the pixel areas PXA may include the light emitting area and the light blocking area BA. An incident light which is generated by the lower panel 100 and incident into the upper panel 200 may be emitted to outside the display device 10 through the light emitting area. In an embodiment, for example, the light emitting area may include a plurality of light emitting areas including a first light emitting area LA1, a second light emitting area LA2 and a third light emitting area LA3 (e.g., first to third light emitting areas LA1, LA2 and LA3).

Transmitted lights having different colors may be emitted from the first to third light emitting areas LA1, LA2, and LA3, respectively. In an embodiment, for example, the first light emitting area LA1 may emit a first transmitted light having a first color, the second light emitting area LA2 may emit a second transmitted light having a second color, and the third light emitting area LA3 may emit a third transmitted light having a third color. In an embodiment, for example, the first color may be blue, the second color may be red and the third color may be green. In an embodiment, for example, the incident light may have the first color. However, embodiments are not limited thereto.

In an embodiment, as illustrated in FIG. 4, the first to third light emitting areas LA1, LA2, and LA3 may be spaced apart from each other in a plan view, and may be arranged in a repeated sequence. The light blocking area BA may extend along or around (e.g., surround) the first to third light emitting areas LA1, LA2, and LA3 in a plan view.

The first to third color filter layers 222, 224, and 226 may be disposed in the display area DA under the upper substrate 210 and may overlap the light emitting area. In an embodiment, for example, the first color filter layer 222 may overlap or correspond to the first light emitting area LA1 and may selectively transmit a light having the first color. The second color filter layer 224 may overlap or correspond to the second light emitting area LA2 and may selectively transmit a light having the second color. The third color filter layer 226 may overlap or correspond to the third light emitting area LA3 and may selectively transmit a light having the third color.

The light blocking layer 223 may be disposed in the display area DA under the upper substrate 210 and may overlap or correspond to the light blocking area BA. In an embodiment, for example, an entirety of the light blocking layer 223 may be disposed in the light blocking area BA so that the light blocking layer 223 may extend along or around (e.g., surround) each of the first to third light emitting areas LA1, LA2 and LA3 in a plan view. The light blocking layer 223 may prevent or reduce color mixing of lights emitted from the first to third light emitting areas LA1, LA2 and LA3 adjacent to each other. In an embodiment, for example, the light blocking layer 223 may include a light blocking material such as black pigment, dye, carbon black and/or the like.

The low refractive layer 230 may be disposed in the display area DA under the upper substrate 210. In an embodiment, for example, a refractive index of the low refractive layer 230 may be smaller than each of a refractive index of the first color conversion part 252, a refractive index of the second color conversion part 254 and a refractive index of the transmission part 256. Accordingly, the low refractive layer 230 may improve light extraction efficiency so that luminance and lifespan of the display device 10 may be improved.

FIG. 3 illustrates that the low refractive layer 230 is disposed between the color filter layer (e.g., the first to third color filter layers 222, 224, and 226) and the partition wall 260, or between the color filter layer and the color conversion layer (e.g., the first color conversion part 252, the second color conversion part 254 and the transmission part 256), but embodiments are not limited thereto. In an embodiment, for example, the low refractive layer 230 may be disposed under the partition wall 260 or under the color conversion layer (e.g., the first color conversion part 252, the second color conversion part 254 and the transmission part 256). In an embodiment, for example, a first low refractive layer may be disposed between the color filter layer (e.g., the first to third color filter layers 222, 224, and 226) and the partition wall 260, or between the color filter layer and the color conversion layer (e.g., the first color conversion part 252, the second color conversion part 254 and the transmission part 256), and a second low refractive layer may be disposed under the partition wall 260 or under the color conversion layer (e.g., the first color conversion part 252, the second color conversion part 254 and the transmission part 256). In an embodiment, for example, the low refractive layer 230 may be omitted. As being under, an element may be further from the upper substrate 210 than another element along the thickness direction.

The first passivation layer 240 may be disposed under the upper substrate 210. In an embodiment, for example, the first passivation layer 240 may be disposed in an entirety of the display area DA and an entirety of the peripheral area PA, under the upper substrate 210. The first passivation layer 240 may extend from the display area DA to cover the first color filter layer 222, the second color filter layer 224, the third color filter layer 226, the light blocking layer 223 and the low refractive layer 230 which are under the upper substrate 210. In an embodiment, for example, the first passivation layer 240 may be disposed only in the display area DA, under the upper substrate 210. The first passivation layer 240 may include an inorganic insulating material such as silicon oxide, silicon nitride, silicon oxynitride and/or the like.

The partition wall 260 may be disposed in the display area DA, under the upper substrate 210. A plurality of openings may be provided or formed in the partition wall 260. In an embodiment, for example, as illustrated in FIG. 4, the plurality of openings defined in or by portions of the partition wall 260 may expose elements of the first to third light emitting areas LA1, LA2 and LA3, respectively, to outside the partition wall 260. In an embodiment, for example, the partition wall 260 may form a space (e.g., opening) which receives an ink composition for providing or forming the first color conversion part 252, the second color conversion part 254 and the transmission part 256. In other words, the partition wall 260 may overlap or correspond to an entirety of the light blocking area BA, and may have a grid shape or a matrix shape in a plan view.

In an embodiment, the partition wall 260 may include an organic material such as a photoresist, an epoxy resin, a phenolic resin, an acrylic resin, a silicone resin and/or the like. The partition wall 260 may further include a light blocking material. In an embodiment, for example, at least a portion of the partition wall 260 may include the light blocking material such as a pigment, a dye, a carbon black and/or the like.

The first and second color conversion parts 252 and 254 may be disposed in the display area DA, under the upper substrate 210, and may overlap the light emitting area. In an embodiment, for example, the first color conversion part 252 may overlap the second light emitting area LA2 and the second color conversion part 254 may overlap the third light emitting area LA3.

The first color conversion part 252 may overlap the second light emitting area LA2. The first color conversion part 252 may convert (e.g., wavelength convert) the incident light into the second transmitted light having the second color. In an embodiment, for example, the first color conversion part 252 may include a resin part 252a and a wavelength-converting particle 252b provided in plural including wavelength-converting particles 252b.

In an embodiment, for example, each of the wavelength-converting particles 252b may include a quantum dot. The quantum dot may be defined as a nano-crystalline semiconductor material. The quantum dot may absorb an incident light and emit a light having a wavelength different from a wavelength of the incident light. In an embodiment, the quantum dot may have a diameter (e.g., an average particle size) equal to or less than about 100 nanometers (nm). In an embodiment, the quantum dot may have a diameter of about 1 nanometer (nm) to about 20 nm. In an embodiment, each of the wavelength-converting particles 252b may include a quantum dot that absorbs blue light and emits red light.

The wavelength-converting particles 252b may be disposed in the resin part 252a. In an embodiment, for example, the resin part 252a may include an epoxy resin, an acrylic resin, a phenolic resin, a melamine resin, a cardo resin, an imide resin and/or the like.

In an embodiment, the first color conversion part 252 may further include a scattering particle 252c provided in plural including scattering particles 252c. The scattering particles 252c may scatter the incident light without substantially changing the wavelength of the incident light. Therefore, a path of a light progressing in (e.g., progressing through) the first color conversion part 252 may be increased. In an embodiment, for example, the scattering particles 252c may include a metal oxide or an organic material.

In an embodiment, for example, the first color conversion part 252 may change the wavelength of the incident light having a blue color (e.g., blue incident light) to emit the second transmitted light having a red color (e.g., red transmitted light). A remainder of the blue incident light, which is not color-changed in the first color conversion part 252, may be blocked by the second color filter layer 224. Accordingly, the second light emitting area LA2 may selectively emit the red transmitted light.

The second color conversion part 254 may overlap the third light emitting area LA3. The second color conversion part 254 may convert the incident light into the third transmitted light having the third color. In an embodiment, for example, the second color conversion part 254 may include a resin part 254a and a wavelength-converting particle 254b provided in plural including wavelength-converting particles 254b. The resin part 254a may include substantially the same material as the resin part 252a of the first color conversion part 252. A scattering particle 254c may be provided in plural including scattering particles 254c and may include substantially the same material as the scattering particles 252c of the first color conversion part 252.

In an embodiment, each of the wavelength-converting particles 254b may include a quantum dot that absorbs blue light and emits green light. In an embodiment, for example, the second color conversion part 254 may change the wavelength of the incident light having a blue color (e.g., blue incident light) to emit the third transmitted light having a green color (e.g., green transmitted light). A remainder of the blue incident light, which is not color-changed in the second color conversion part 254, may be blocked by the third color filter layer 226. Accordingly, the third light emitting area LA3 may selectively emit the green transmitted light.

In an embodiment, each of the quantum dots included in the first and second color conversion parts 252 and 254 may include a II-VI group compound, a III-V group compound, a IV-VI group compound, a IV group element, a IV group compound, or a combination thereof.

In an embodiment, for example, the II-VI group compound may include a binary compound selected from CdSe, CdTe, ZnS, ZnSe, ZnTe, ZnO, HgS, HgSe, HgTe, MgSe, MgS and a combination thereof, a ternary compound selected from CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS and a combination thereof, or a quaternary compound selected from HgZnTeS, CdZnSeS, CdZnSeTe, CdZnSTe, CdHgSeS, CdHgSeTe, CdHgSTe, HgZnSeS, HgZnSeTe, HgZnSTe and a combination thereof.

In an embodiment, for example, the III-V group compound may include a binary compound selected from GaN, GaP, GaAs, GaSb, AlN, AlP, AlAs, AlSb, InN, InP, InAs, InSb and a combination thereof, a ternary compound selected from GaNP, GaNAs, GaNSb, GaPAs, GaPSb, AlNP, AlNAs, AlNSb, AlPAs, AlPSb, InNP, InNAs, InNSb, InPAs, InPSb, GaAlNP and a combination thereof, or a quaternary compound selected from GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb and a combination thereof.

In an embodiment, for example, the IV-VI group compound may include a binary compound selected from SnS, SnSe, SnTe, PbS, PbSe, PbTe and a combination thereof, a ternary compound selected from SnSeS, SnSeTe, SnSTe, PbSeS, PbSeTe, PbSTe, SnPbS, SnPbSe, SnPbTe and a combination thereof, or a quaternary compound selected from SnPbSSe, SnPbSeTe, SnPbSTe and a combination thereof.

In an embodiment, for example, the IV group element may include Si, Ge or a combination thereof. The IV group compound may include a binary compound selected from SiC, SiGe and a combination thereof.

In an embodiment, for example, the quantum dot may have a core-shell structure including a core and a shell which surrounds the core. In an embodiment, for example, the core and the shell may include different materials.

Even if the quantum dots included in the first and second color conversion parts 252 and 254 include the same material, light emitted from the respective first and second color conversion parts 252 and 254 may have different wavelengths from each other according to sizes of the quantum dots of the first and second color conversion parts 252 and 254. In an embodiment, for example, the smaller a size of a quantum dot, the shorter a wavelength of light emitted from the quantum dot. Accordingly, light of different visible colors may be emitted by adjusting sizes of the quantum dots within the first and second color conversion parts 252 and 254.

The transmission part 256 may be disposed in the display area DA, under the upper substrate 210, and may overlap the first light emitting area LA1. In an embodiment, for example, the transmission part 256 may include a resin part 256*a* and a scattering particles 256*c* provided in plural including scattering particles 256*c*. The resin part 256*a* may include substantially the same material as the resin part 252*a* of the first color conversion part 252. The scattering particles 256*c* may include substantially the same material as the scattering particles 252*c* of the first color conversion part 252.

The transmission part 256 may not convert the incident light, and may emit the first transmitted light substantially the same as (e.g., substantially the same wavelength as) the incident light (e.g., unconverted). In an embodiment, for example, the transmission part 256 may absorb the incident light having a blue color (e.g., blue incident light) and emit the third transmitted light having a blue color.

The first color conversion part 252, the second color conversion part 254 and the transmission part 256 may be disposed in each of the plurality of openings defined in the partition wall 260, respectively. In other words, the partition wall 260 may surround side surfaces of the first color conversion part 252, the second color conversion part 254 and the transmission part 256.

The second passivation layer 270 may be disposed under the upper substrate 210. In an embodiment, for example, the second passivation layer 270 may be disposed in an entirety of the display area DA and an entirety of the peripheral area PA, under the upper substrate 210. In an embodiment, for example, the second passivation layer 270 may cover the partition wall 260, the first color conversion part 252, the second color conversion part 254, the transmission part 256 and the upper dam 280 which are under the upper substrate 210. In an embodiment, for example, the second passivation layer 270 may be disposed only in the display area DA, under the upper substrate 210. The second passivation layer 270 may be included in the lower panel 100, such as disposed on the encapsulation layer 170 and further from the lower substrate 110 than the encapsulation layer 170. In an embodiment, for example, the second passivation layer 270 may include an inorganic insulating material such as silicon oxide, silicon nitride, silicon oxynitride and/or the like.

The upper dam 280 may be disposed in the peripheral area PA, under the upper substrate 210. In an embodiment, for example, the upper dam 280 may be disposed in the peripheral area PA, under the first passivation layer 240 which extends from the display area DA to define an extended portion of the first passivation layer 240 in the peripheral area PA.

In a direction along the upper substrate 210, the upper dam 280 may be spaced apart from the partition wall 260 which is disposed in the display area DA. In an embodiment, the upper dam 280 may include a first upper dam 281 and a second upper dam 282. The first upper dam 281 may be closer to the display area DA than the second upper dam 282. The upper substrate 210 may have an outer edge which is furthest from the display area DA, and the second upper dam 282 may be closest to the outer edge among the first upper dam 281 and the second upper dam 282.

The first upper dam 281 may extend along or around (e.g., surround) the display area DA. In an embodiment, for example, as illustrated in FIG. 4, the first upper dam 281 may be spaced apart from the partition wall 260 in the direction along the upper substrate 210, and may extend along or around the partition wall 260. For example, the first upper dam 281 may have a hollow rectangular shape (e.g., a rectangular frame shape) in a plan view.

A first opening OP1 may be defined or formed between the partition wall 260 and the first upper dam 281. That is, the first opening OP1 may be defined as a space at which the first upper dam 281 is spaced apart from the partition wall 260. In an embodiment, for example, the first opening OP1 may have a hollow rectangular shape (e.g., a rectangular frame shape) in a plan view. The first opening OP1 is open in a direction away from the upper substrate 210. The first opening OP1 may be open to the gap defined between the lower panel 100 and the upper panel 200 along the thickness direction. In an embodiment, for example, the first opening OP1 may accommodate a portion of the filling member 300 positioned in the peripheral area PA. This will be described in detail later.

The second upper dam 282 may be spaced apart from the first upper dam 281, and may be extended along or around the first upper dam 281 in the plan view. In an embodiment, for example, the second upper dam 282 may have a hollow rectangular shape (e.g., a rectangular frame shape which has an open volume) in a plan view.

A second opening OP2 may be defined or formed between the first upper dam 281 and the second upper dam 282. That is, the second opening OP2 may be defined as a space at which the second upper dam 282 is spaced apart from the first upper dam 281. In an embodiment, for example, the second opening OP2 may have a hollow rectangular shape (e.g., a rectangular frame shape which has an open volume) in a plan view. The second opening OP2 is open in a direction away from the upper substrate 210. Similar to the first opening OP1, the second opening OP2 may be open to the gap defined between the lower panel 100 and the upper panel 200 along the thickness direction. In an embodiment, for example, the second opening OP2 may accommodate a portion of the filling member 300 positioned in the peripheral area PA (refer to dotted line in FIG. 3).

In an embodiment, each of the first and second upper dams 281 and 282 may include substantially the same material as the partition wall 260, and may be substantially simultaneously (or concurrently) provided or formed with the partition wall 260. In an embodiment, for example, each of the first and second upper dams 281 and 282 may have substantially the same or similar thickness as the partition wall 260. The thickness may be a maximum dimension of an element along the thickness direction (e.g., third direction), for example, the vertical direction in FIG. 3.

In an embodiment, the first upper dam 281 may overlap the first lower dam 181, and the second upper dam 282 may overlap the second lower dam 182. In an embodiment, for example, the first upper dam 281 may be positioned corresponding to the first lower dam 181 and spaced apart from the first lower dam 181 along the thickness direction. In an embodiment, for example, the second inorganic encapsulation layer 173 covering the first lower dam 181 on the lower substrate 110 may be spaced apart from the second passivation layer 270 covering the first upper dam 281 under the upper substrate 210. Likewise, the second upper dam 282 may be positioned corresponding to the second lower dam 182 and spaced apart from the second lower dam 182 along the thickness direction.

The first and second upper dams 281 and 282 which respectively correspond to of the first and second lower dams 181 and 182 may contribute to maintaining a gap in the peripheral area PA between the lower panel 100 and the upper panel 200. Accordingly, a reliability of the display device 10 may be improved.

The filling member 300 may be disposed in the display area DA between the lower substrate 110 and the upper substrate 210, at the gap therebetween. In an embodiment, for example, the filling member 300 may be disposed between the second inorganic encapsulation layer 173 included in the lower panel 100 and the second passivation layer 270 included in the upper panel 200.

In an embodiment, the filling member 300 may include a material which transmits light. In an embodiment, for example, the filling member 300 may include an organic material such as a silicone resin, an epoxy resin, an epoxy-acrylic resin and/or the like. In an embodiment, for example, the filling member 300 may include an appropriate and/or suitable material for matching a refractive index. The filling member 300 may function as a buffer against external pressure applied to the display device 10. In addition, the filling member 300 may maintain the gap between the lower panel 100 and the upper panel 200 (e.g., gap-maintaining layer).

In an embodiment, for example, as illustrated in FIG. 3, the filling member 300 disposed in the display area DA may extend from the display area DA and into the peripheral area PA so that a portion of the filling member 300 may be positioned in the first opening OP1 (e.g., an extended portion of the filling member 300). That is, the filling member 300 may be partially positioned in the first opening OP1. In an embodiment, for example, a portion of the filling member 300 may be positioned in the second opening OP2 (refer to a dotted line in FIG. 3).

In an embodiment, in an embodiment of the process of providing or manufacturing the display device 10, after disposing (e.g., applying) the filling member 300 in the display area DA, under the upper panel 200, the upper panel 200 and the lower panel 100 may be combined with each other by the sealing member 400. At this time, the filling member 300 may be compressed by the combination of the upper panel 200 and the lower panel 100 so that the filling member 300 in the display area DA may extend and flow into the peripheral area PA. In an embodiment, for example, if there is a difference in the amount of the filling member 300 applied to the upper panel 200 and/or the degree of compression of the filling member 300, the amount of the filling member 300 extending to the peripheral area PA may be different.

According to a conventional display device, the openings (e.g., the first opening OP1 and/or the second opening OP2) may not be provided or formed between the partition wall 260 and the upper dam 280. A width (e.g., a width in left and right directions of FIG. 3) of a portion of the filling member 300 positioned in the peripheral area PA may vary corresponding to the amount of the filling member 300 extending to the peripheral area PA from the display area DA. Accordingly, the width of the portion of the filling member 300 positioned in the peripheral area PA cannot be easily controlled so that the reliability of the conventional display device may be reduced. In detail, when the filling member 300 extends to an area where the sealing member 400 is disposed, a gap may be defined or formed between the sealing member 400 and the upper panel 200 within the conventional display device. Accordingly, foreign substances may penetrate into the gap so that defects of the conventional display device may occur.

According to one or more embodiment of the display device 10, the first upper dam 281 may be spaced apart from the partition wall 260, and the first opening OP1 may be defined or formed between the partition wall 260 and the first upper dam 281. The first opening OP1 may accommodate a portion of the filling member 300 positioned in the peripheral area PA. Accordingly, the first upper dam 281 may prevent or reduce overflowing of the filling member 300 to outside of the first upper dam 281 (e.g., to the left side of the first upper dam 281 of FIG. 3). In addition, the second upper dam 282 may be spaced apart from the first upper dam 281, and the second opening OP2 may be defined or formed between the first upper dam 281 and the second upper dam 282. The second opening OP2 may accommodate a portion of the filling member 300 flowing beyond the first upper dam 281. Accordingly, even if the amount of the filling member 300 extending to the peripheral area PA is relatively large so that the filling member 300 overflows to the outside of the first upper dam 281, the second upper dam 282 may prevent or reduce overflowing of the filling member 300 to an outside of the second upper dam 282 (e.g., to the left side of the second upper dam 282 of FIG. 3). Accordingly, even if the amount of the filling member 300 applied to the upper panel 200 and/or the degree of compression of the filling member 300 varies, a width (e.g., a width in left and right directions) of a portion of the filling member 300 positioned in the peripheral area PA may be easily controlled by the first and second upper dams 281 and 282. Accordingly, the reliability of the display device 10 may be improved.

The sealing member 400 may be disposed in the peripheral area PA between the lower substrate 110 and the upper substrate 210, and the lower substrate 110 and the upper substrate 210 may be combined with each other by the sealing member 400. In an embodiment, for example, the sealing member 400 may be positioned outside of the first and second upper dams 281 and 282 (e.g., at the left side of the first and second upper dams 281 and 282 of FIG. 3). In other words, the sealing member 400 may be spaced apart from the partition wall 260 with the first and second upper dams 281 and 282 therebetween in a direction along the upper substrate 210. That is, the sealing member 400 may be spaced apart from the first and second upper dams 281 and 282 to extend along and/or surround the first and second upper dams 281 and 282. In an embodiment, for example, the sealing member 400 may have a rectangular shape (e.g., a rectangular frame shape) in a plan view. However, embodiments are not limited thereto, and the sealing member 400 may have various planar shapes corresponding to a planar shape of the lower panel 100 and/or the upper panel 200. In an embodiment, for example, when the lower panel 100 and/or the upper panel 200 has a planar shape such as a triangle, a rhombus, a polygon, a circle, an oval or the like, the sealing member 400 may have a corresponding planar shape of a hollow triangle, a hollow rhombus, a hollow polygon, a hollow circle, a hollow oval or the like in a plan view.

Figure 5:
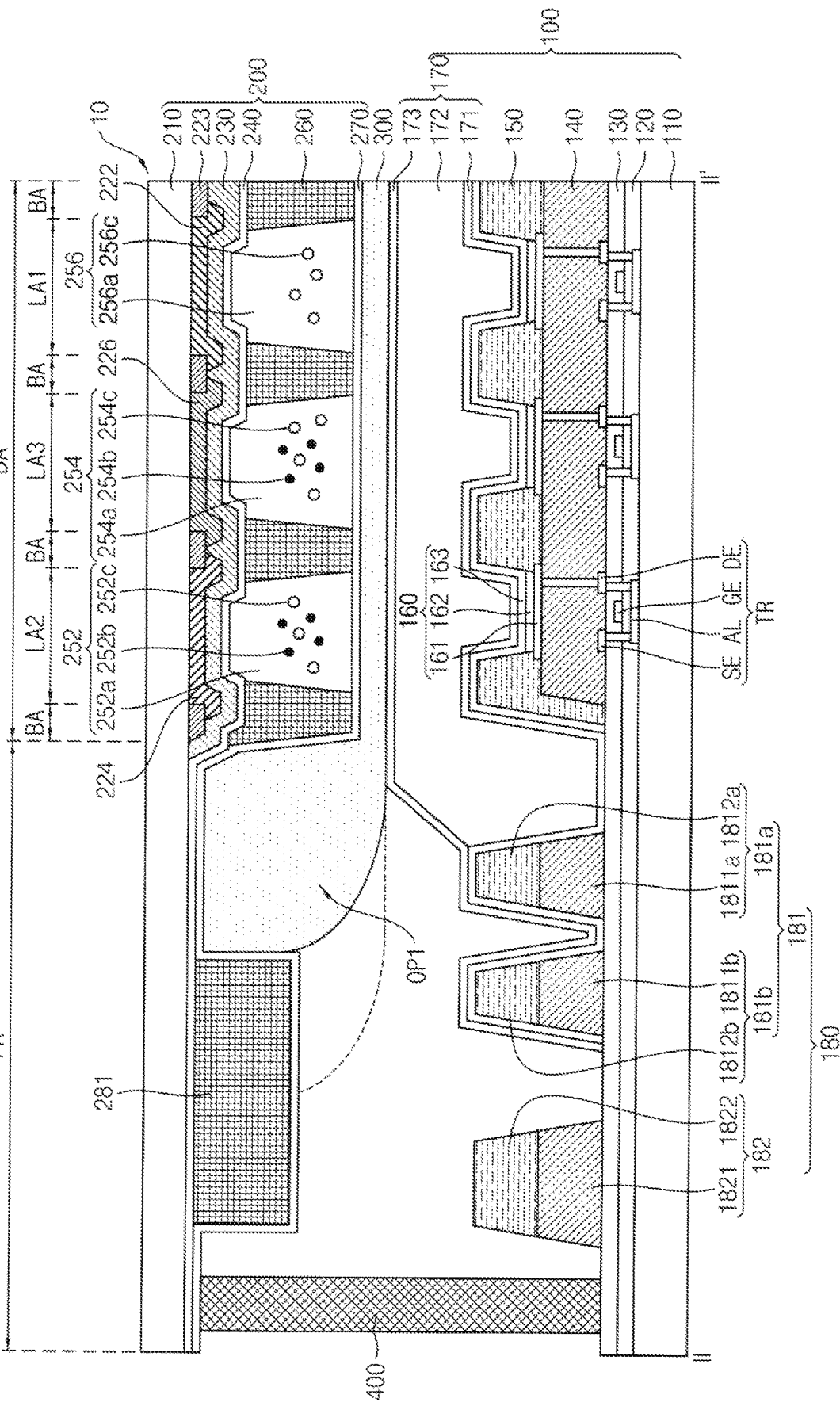
FIG. 5 is a cross-sectional view illustrating an embodiment of a display device taken along line II-II' of FIG. 1.

FIG. 5 is a cross-sectional view illustrating an embodiment of the display device 10 taken along the line of FIG. 1. Taking FIGS. 4 and 5 together, portions of the first upper dam 281 may have a length extending along a respective outer edge of the display device 10 (e.g., length direction) and a width which is taken in a direction crossing the length direction such as a direction perpendicular thereto.

Referring to FIG. 5, in an embodiment, the first upper dam 281 may overlap or correspond to both of the first lower dam 181 and the second lower dam 182. In an embodiment, for example, the second upper dam 282 may be omitted, and the first upper dam 281 may be provided or formed as a single body which overlaps both of the first and second lower dams 181 and 182. That is, the first upper dam 281 may be provided or formed to have a width (e.g., width in left and right directions) corresponding to a width occupied by the first and second lower dams 181 and 182. In an embodiment, for example, the width of the first upper dam 281 of the embodiment of FIG. 5 may be greater than the width of the first upper dam 281 of the embodiment of FIG. 3.

In an embodiment, for example, a portion of the filling member 300 positioned in the peripheral area PA may extend into the first opening OP1. In addition, a portion of the filling member 300 may be positioned under a lower surface of the first upper dam 281 which is furthest from the upper substrate 210 (refer to a dotted line in FIG. 5). That is, a portion of the filling member 300 may face the upper substrate 210 with the first upper dam 281 therebetween.

Figure 6:
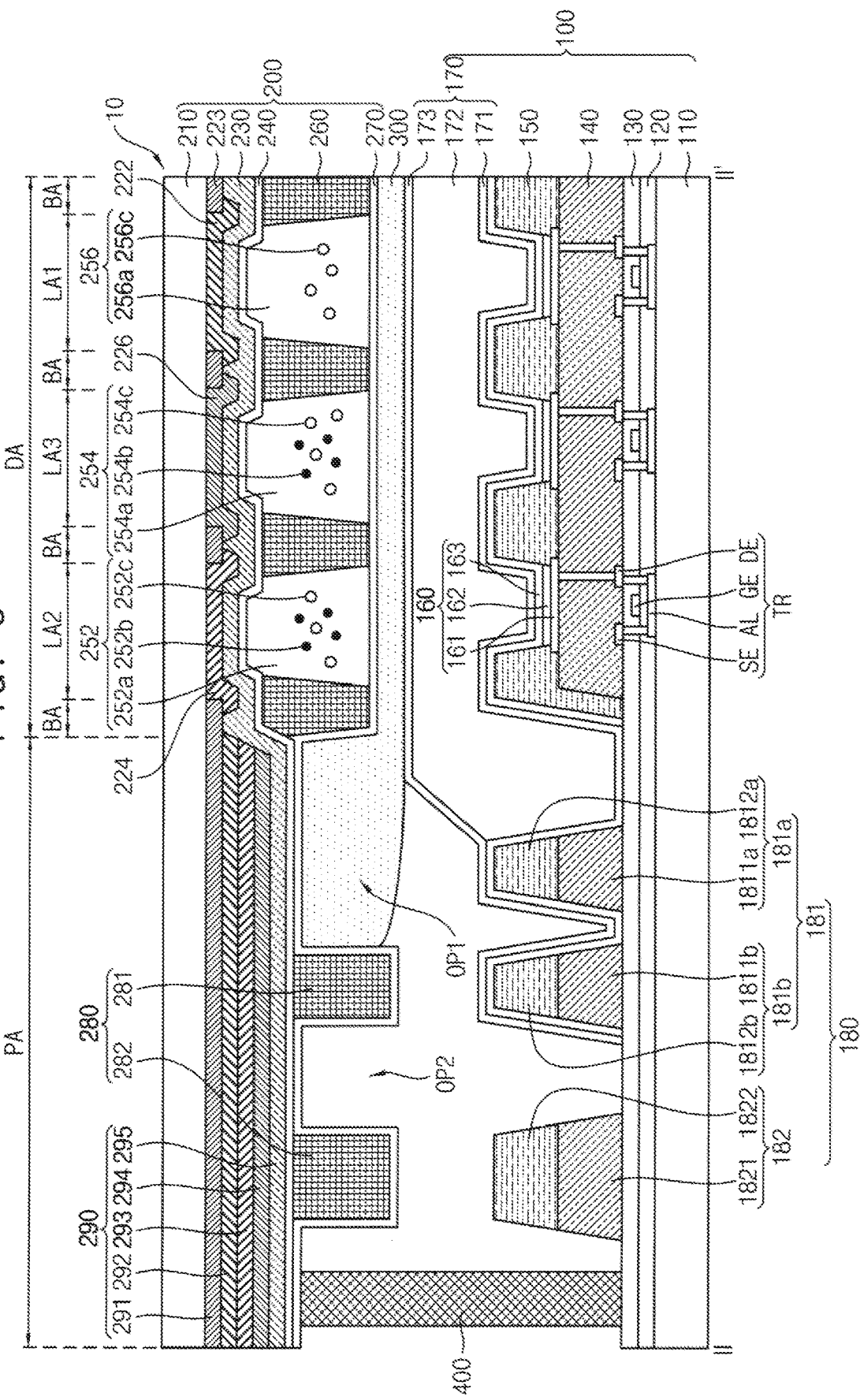
FIG. 6 is a cross-sectional view illustrating an embodiment of a display device taken along line II-II' of FIG. 1.
Figure 7:
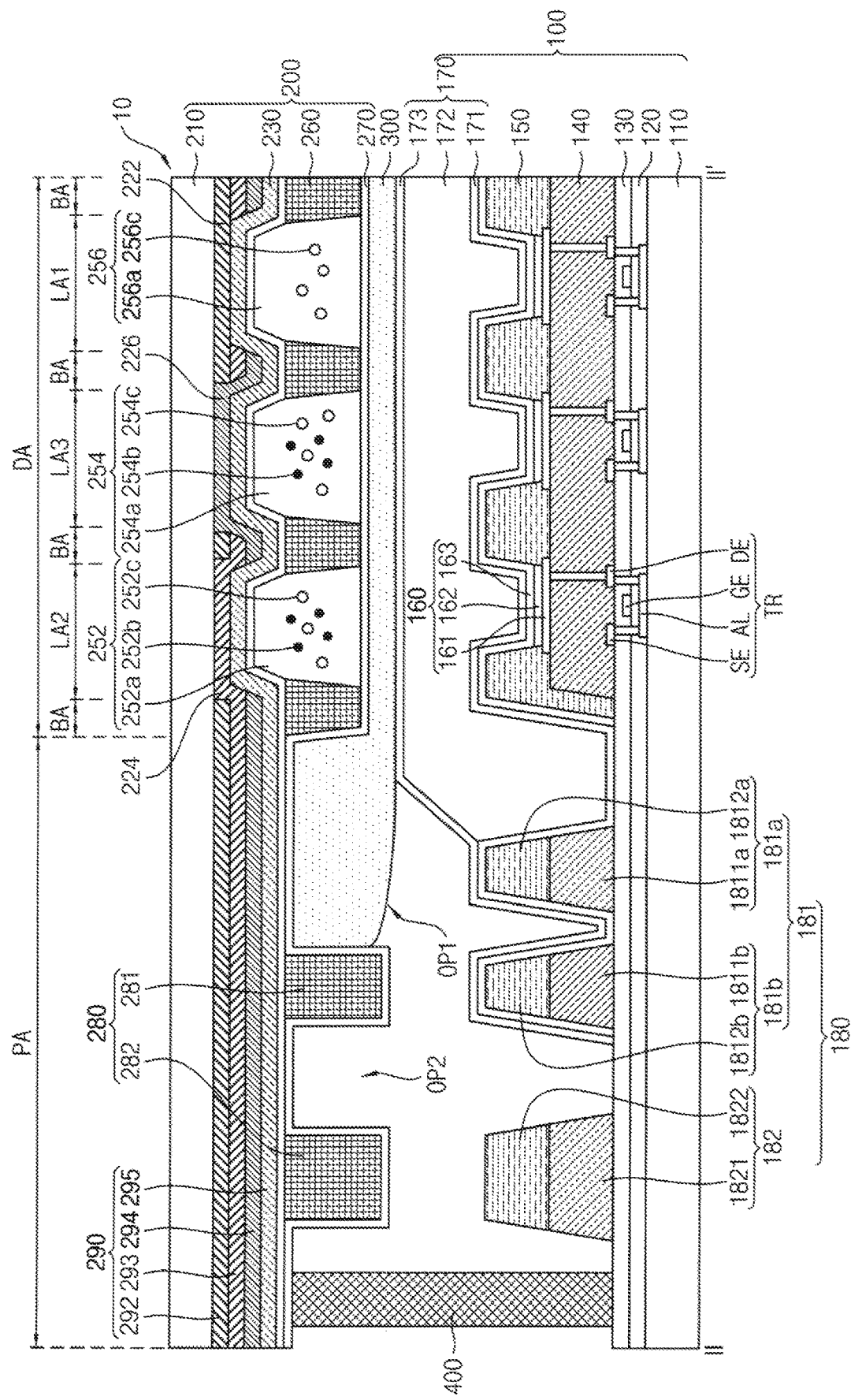
FIG. 7 is a cross-sectional view illustrating an embodiment of a display device taken along line II-II' of FIG. 1.

FIG. 6 is a cross-sectional view illustrating an embodiment of the display device 10 taken along the line of FIG. 1. FIG. 7 is a cross-sectional view illustrating an embodiment of the display device 10 taken along the line II-II' of FIG. 1.

Referring to FIGS. 6 and 7, in an embodiment, the display device 10 may further include an organic layer 290 disposed between the upper substrate 210 and the upper dam 280.

In an embodiment, for example, the organic layer 290 may overlap each of the first upper dam 281, the second upper dam 282, the first opening OP1 and the second opening OP2. That is, the organic layer 290 may be disposed in an entirety of the peripheral area PA between the upper substrate 210 and the upper dam 280.

In an embodiment, for example, a portion of the first passivation layer 240 which is disposed in the peripheral area PA may cover the organic layer 290 under the upper substrate 210. That is, the first passivation layer 240 may be disposed between the organic layer 290 and the upper dam 280.

In an embodiment, for example, the organic layer 290 may include substantially the same material as at least one of the first color filter layer 222, the second color filter layer 224, the third color filter layer 226, the light blocking layer 223, and the low refractive layer 230.

The organic layer 290 may have a single-layered structure or a multi-layered structure along the thickness direction. In an embodiment, for example, the organic layer 290 may have a multi-layered structure including a plurality of layers including different materials. The organic layer 290 may be defined by an extended portion of as at least one of the first color filter layer 222, the second color filter layer 224, the third color filter layer 226, the light blocking layer 223, and the low refractive layer 230.

In an embodiment, as illustrated in FIG. 6, the organic layer 290 may include first to fifth organic layers 291, 292, 293, 294 and 295 sequentially stacked in order from the upper substrate 210.

In an embodiment, for example, the first organic layer 291 may include substantially the same material as the light blocking layer 223, and may be substantially simultaneously (or concurrently) provided or formed with the light blocking layer 223. That is, the light blocking layer 223 in the display area DA may extend from the display area DA to the peripheral area PA to define an extended portion of the light blocking layer 223. The extended portion of the light blocking layer 223 may define the first organic layer 291.

Within the organic layer 290, the second organic layer 292 may include substantially the same material as the first color filter layer 222, and may be substantially simultaneously (or concurrently) provided or formed with the first color filter layer 222. The third organic layer 293 may include substantially the same material as the second color filter layer 224, and may be substantially simultaneously (or concurrently) provided or formed with the second color filter layer 224. The fourth organic layer 294 may include substantially the same material as the third color filter layer 226, and may be substantially simultaneously (or concurrently) provided or formed with the third color filter layer 226. The fifth organic layer 295 may include substantially the same material as the low refractive layer 230, and may be substantially simultaneously (or concurrently) provide or formed with the low refractive layer 230.

As illustrated in FIG. 7, the organic layer 290 may include second to fifth organic layers 292, 293, 294 and 295 sequentially stacked in order from the upper substrate 210. The light blocking layer 223 may be omitted, and the first to third color filter layers 222, 224 and 226 may be disposed to overlap the light blocking area BA of the display area DA. The first to third color filter layers 222, 224 and 226 disposed to overlap the light blocking area BA may prevent or reduce color mixing of the first to third light emitting areas LA1, LA2 and LA3 adjacent to each other.

In an embodiment, for example, the second organic layer 292 may include substantially the same material as the first color filter layer 222, and may be substantially simultaneously (or concurrently) provided or formed with the first color filter layer 222. The third organic layer 293 may include substantially the same material as the second color filter layer 224, and may be substantially simultaneously (or concurrently) provided or formed with the second color filter layer 224. The fourth organic layer 294 may include substantially the same material as the third color filter layer 226, and may be substantially simultaneously (or concurrently) provided or formed with the third color filter layer 226. The fifth organic layer 295 may include substantially the same material as the low refractive layer 230, and may be substantially simultaneously (or concurrently) provided or formed with the low refractive layer 230.

However, the multi-layered structure of the organic layer 290 described with reference to FIGS. 6 and 7 is exemplary, and embodiments are not limited thereto. In an embodiment, for example, the multi-layered structure of the organic layer 290 may be variously modified corresponding to a stacking structure in the display area DA of the upper panel 200 and/or a method of manufacturing the upper panel 200. In an embodiment for example, at least one of the first to fifth organic layers 291, 292, 293, 294 and 295 may be omitted, or another layer may be added. That is, an organic layer 290 may not be disposed between the upper substrate 210 and the upper dam 280, an organic layer 290 having a single-layered structure may be disposed between the upper substrate 210 and the upper dam 280, or an organic layer 290 having a multi-layered structure including two or more layers may be disposed between the upper substrate 210 and the upper dam 280.

According to one or more embodiment related to FIGS. 6 and 7, the organic layer 290 having the single-layered structure or the multi-layered structure may be disposed in the peripheral area PA between the upper substrate 210 and the upper dam 280. The organic layer 290 may overlap both of the first and second upper dams 281 and 282. Accordingly, a separation distance along the thickness direction between the first upper dam 281 and the first lower dam 181 and a separation distance along the thickness direction between the second upper dam 282 and the second lower dam 282 may be relatively small. Accordingly, the organic layer 290 may contribute to maintaining the gap in the peripheral area PA between the lower panel 100 and the upper panel 200. In addition, the organic layer 290 disposed in an entirety of the peripheral area PA may reduce reflection of external light incident from outside the display device 10 and into the display device 10 through the upper substrate 210.

Figure 8:
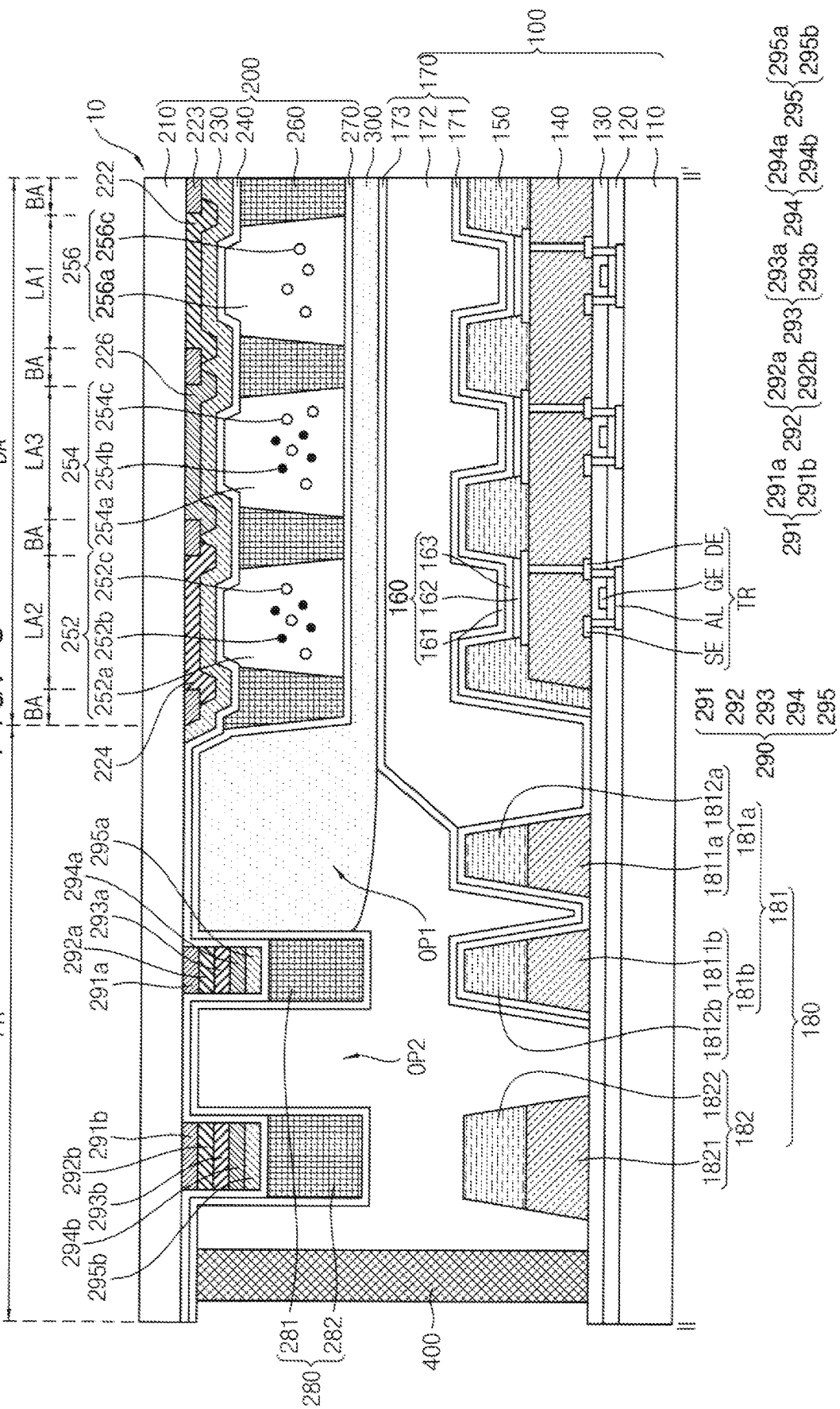
FIG. 8 is a cross-sectional view illustrating an embodiment of a display device taken along line II-II' of FIG. 1.
Figure 9:
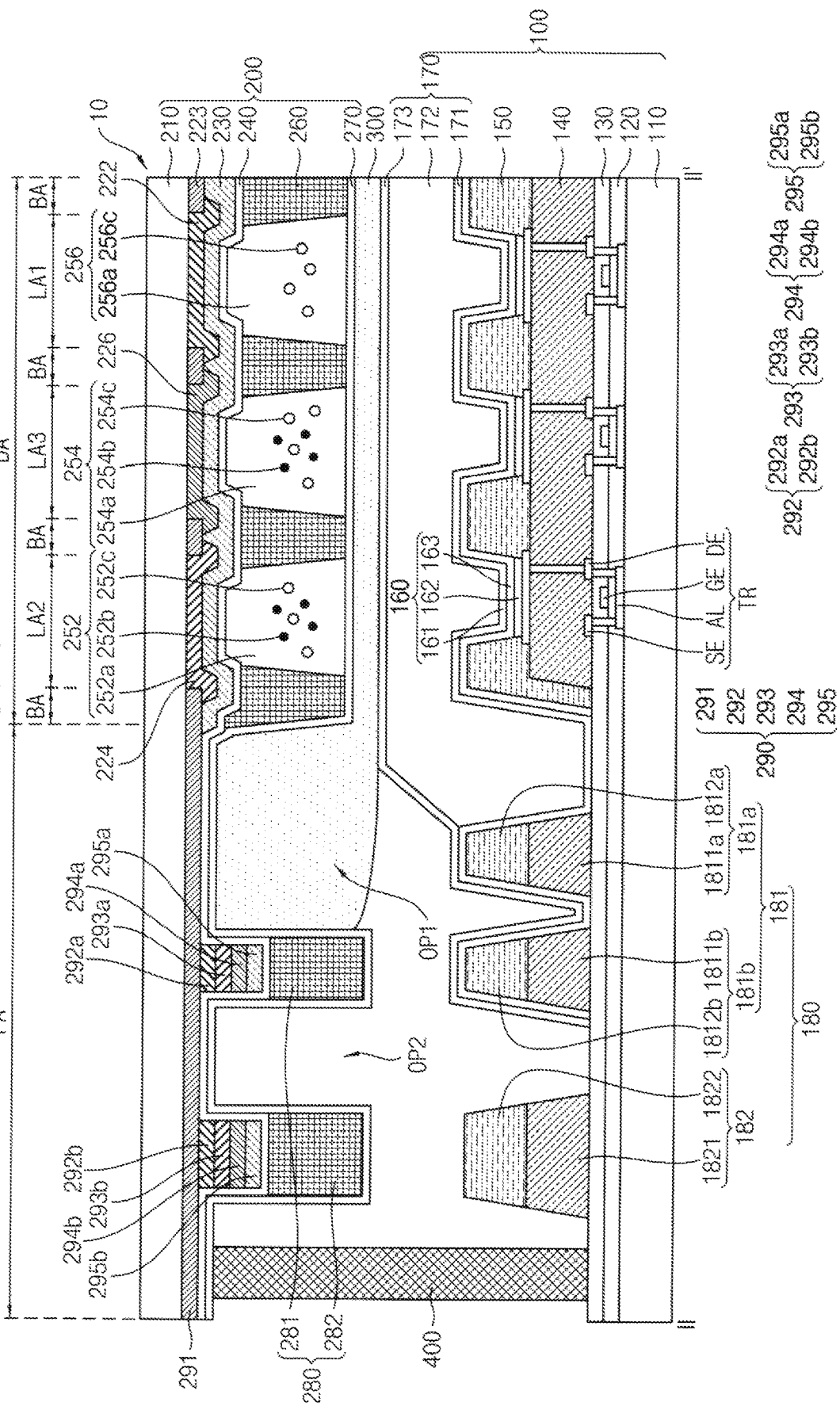
FIG. 9 is a cross-sectional view illustrating an embodiment of a display device taken along line II-II' of FIG. 1.

FIG. 8 is a cross-sectional view illustrating an embodiment of the display device 10 taken along the line of FIG. 1. FIG. 9 is a cross-sectional view illustrating an embodiment of a display device 10 taken along the line of FIG. 1.

Referring to FIGS. 8 and 9, in an embodiment, the organic layer 290 may not overlap the first and second openings OP1 and OP2 (e.g., may be spaced apart from the opening. When the organic layer 290 has a multi-layered structure including a plurality of layers, at least one of the plurality of layers may not overlap the first and second openings OP1 and OP2.

As illustrated in FIG. 8, for example, all of the plurality of layers of the organic layer 290 may not overlap the first and second openings OP1 and OP2. In an embodiment, for example, each of the first to fifth organic layers 291, 292, 293, 294 and 295 may not overlap the first and second openings OP1 and OP2.

The first organic layer 291 may include a first-first organic layer 291a (e.g., first organic pattern) and a first-second organic layer 291b (e.g., second organic pattern) which is spaced apart from the first-first organic layer 291a. The first-first organic layer 291a may overlap or correspond to the first upper dam 281 and may not overlap the first opening OP1. In addition, the first-first organic layer 291a may not overlap the second upper dam 282 and the second opening OP2. That is, the first-first organic layer 291a may be spaced apart from each of the first opening OP1, the second opening OP2 and the second upper dam 282 in a plan view. In other words, the first-first organic layer 291a may have a width (e.g., a width in left and right directions of FIG. 8) corresponding to a width of the first upper dam 281.

The first-second organic layer 291b may overlap or correspond to the second upper dam 282 and may not overlap the second opening OP2. In addition, the first-second organic layer 291b may not overlap the first upper dam 281 and the first opening OP1. That is, the first-second organic layer 291b may be spaced apart from each of the first opening OP1, the second opening OP2 and the first upper dam 281 in a plan view. In other words, the first-second organic layer 291b may have a width (e.g., a width in left and right directions) corresponding to a width of the second upper dam 282.

The second organic layer 292 may include a second-first organic layer 292a and a second-second organic layer 292b (e.g., first and second organic patterns). The third organic layer 293 may include a third-first organic layer 293a and a third-second organic layer 293b. The fourth organic layer 294 may include a fourth-first organic layer 294a and a fourth-second organic layer 294b. The fifth organic layer 295 may include a fifth-first organic layer 295a and a fifth-second organic layer 295b.

Each of the second-first organic layer 292a, the third-first organic layer 293a, the fourth-first organic layer 294a and the fifth-first organic layer 295a may have substantially the same or similar planar shape as the first-first organic layer 291a. That is, each of the second-first organic layer 292a, the third-first organic layer 293a, the fourth-first organic layer 294a and the fifth-first organic layer 295a may overlap or correspond to the first upper dam 281, and may not overlap each of the second upper dam 282, the first opening OP1 and the second opening OP2.

Each of the second-second organic layer 292b, the third-second organic layer 293b, the fourth-second organic layer 294b and the fifth-second organic layer 295b may have substantially the same or similar planar shape as the first-second organic layer 291b. That is, each of the second-second organic layer 292b, the third-second organic layer 293b, the fourth-second organic layer 294b and the fifth-second organic layer 295b may overlap or correspond to the second upper dam 282, and may not overlap each of the first upper dam 281, the first opening OP1 and the second opening OP2.

According to one or more embodiment related to FIG. 8, each of the plurality of layers included in the organic layer 290 having a multi-layered structure may be disposed to overlap the first and second upper dams 281 and 282. Accordingly, the separation distance along the thickness direction between the first upper dam 281 and the first lower dam 181 and the separation distance along the thickness direction between the second upper dam 282 and the second lower dam 182 may be relatively less. Accordingly, the organic layer 290 may contribute to maintaining the gap in the peripheral area PA between the lower panel 100 and the upper panel 200.

In addition, each of the plurality of layers may not overlap the first and second openings OP1 and OP2. Accordingly, the size of each of the first and second openings OP1 and OP2 to accommodate the portion of the filling member 300 positioned in the peripheral area PA may be relatively large. Accordingly, a width (e.g., a width in left and right directions) of the portion of the filling member 300 positioned in the peripheral area PA may be easily controlled.

As illustrated in FIG. 9, at least one of the plurality of layers of the organic layer 290 may overlap or correspond to the first and second openings OP1 and OP2, and at least one of the plurality of layers of the organic layer 290 may not overlap the first and second openings OP1 and OP2.

In an embodiment, for example, the first organic layer 291 may overlap both of the first and second openings OP1 and OP2, and each of the second to fifth organic layers 292, 293, 294 and 295 may not overlap the first and second openings OP1 and OP2. That is, the second organic layer 292 may include the second-first organic layer 292a and the second-second organic layer 292b. The third organic layer 293 may include the third-first organic layer 293a and the third-second organic layer 293b. The fourth organic layer 294 may include the fourth-first organic layer 294a and the fourth-second organic layer 294b. The fifth organic layer 295 may include the fifth-first organic layer 295a and the fifth-second organic layer 295b.

According to one or more embodiment related to FIG. 9, at least one of the plurality of layers included in the organic layer 290 having a multi-layered structure may be disposed in an entirety of the peripheral area PA. In addition, at least one of the plurality of layers may be disposed so as not to overlap the first and second openings OP1 and OP2. That is, a portion of the plurality of layers may be disposed in an entirety of the peripheral area PA so as to overlap the first and second openings OP1 and OP2, and remaining layers may be disposed in the peripheral area PA so as to overlap only the first and second upper dams 281 and 282 (e.g., not overlap the first and second openings OP1 and OP2) in plurality as necessary (e.g., to prevent or reduce reflection of external light).

FIGS. 10 to 18 are cross-sectional views illustrating am embodiment of a method of manufacturing or providing a display device 10 FIGS. 10 to 18 may illustrate a method of providing or manufacturing the display device 10 related to FIG. 9.

Figure 10:
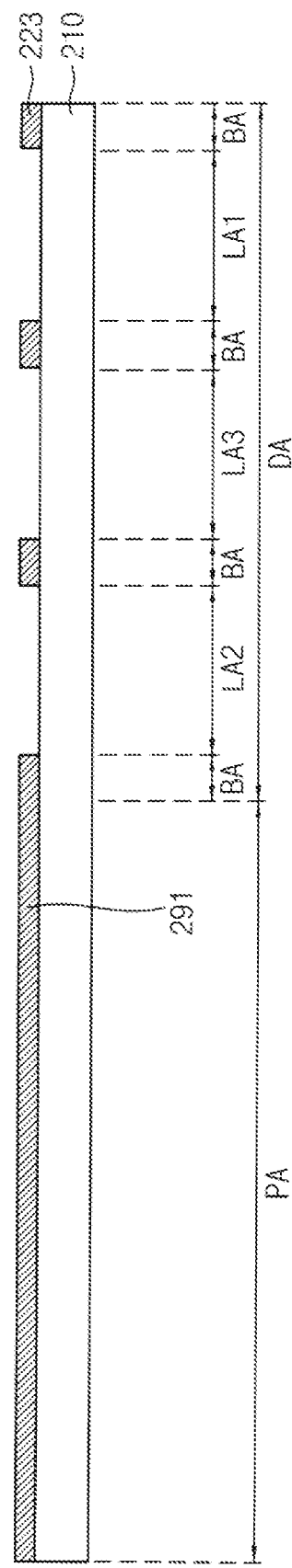
FIGS. 10 to 18 are cross-sectional views illustrating an embodiment of a method of providing a display device.

Referring to FIG. 10, the light blocking layer 223 and the first organic layer 291 may be provided or formed on the upper substrate 210. The light blocking layer 223 may be provided or formed in the display area DA on the upper substrate 210. The light blocking layer 223 may be provided or formed as a plurality of patterns which overlap or correspond to the light blocking area BA in the display area DA. In an embodiment, for example, the light blocking layer 223 may include or be formed of an organic material including a black pigment.

The first organic layer 291 may be provided or formed in the peripheral area PA on the upper substrate 210. In an embodiment, for example, the first organic layer 291 may be formed in an entirety of the peripheral area PA. In an embodiment, for example, the first organic layer 291 may include or be formed of an organic material including a black pigment.

In an embodiment, the light blocking layer 223 and the first organic layer 291 may be substantially simultaneously (or concurrently) provided or formed. In an embodiment, for example, a pre-organic layer may include or be formed of an organic material including a black pigment on the upper substrate 210. The pre-organic layer may be patterned by a photolithography or the like to substantially simultaneously form the light blocking layer 223 and the first organic layer 291 as respective organic patterns of a same material layer (e.g., in a same layer).

Figure 11:
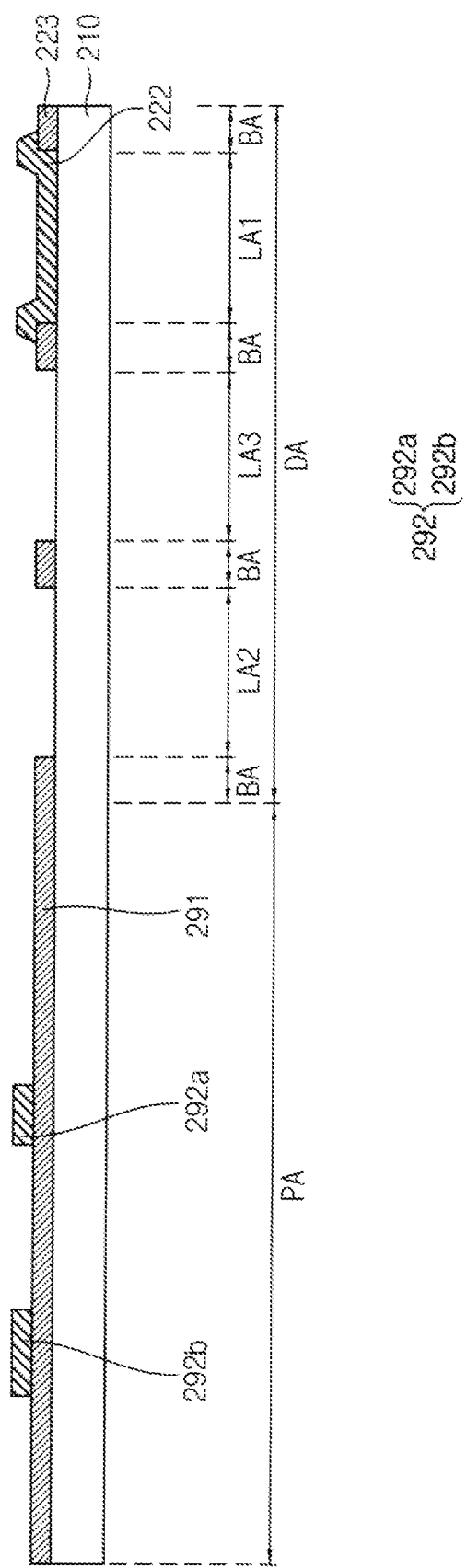

Referring to FIG. 11, the first color filter layer 222, the second-first organic layer 292a and the second-second organic layer 292b may be provided or formed on the upper substrate 210. The first color filter layer 222 may be provided or formed in the display area DA on the upper substrate 210. The first color filter layer 222 may be provided or formed to overlap or correspond to the first light emitting area LA1 in the display area DA. In an embodiment, for example, the first color filter layer 222 may include or be formed of an organic material including a pigment having the first color. In an embodiment, for example, the first color may be blue.

The second-first organic layer 292a and the second-second organic layer 292b may be provided or formed on the first organic layer 291. In an embodiment, for example, the second-first organic layer 292a may be provided or formed to be spaced apart from the display area DA and to surround the display area DA. In an embodiment, for example, the second-second organic layer 292b may be provided or formed to be spaced apart from the second-first organic layer 292a and to surround the second-first organic layer 292a. In an embodiment, for example, the second-first organic layer 292a and the second-second organic layer 292b may include or be formed of an organic material including a pigment having the first color.

In an embodiment, the first color filter layer 222, the second-first organic layer 292a and the second-second organic layer 292b may be substantially simultaneously (or concurrently) provided or formed. In an embodiment, for example, a pre-organic layer may include or be formed of an organic material including a pigment having the first color on the upper substrate 210 and the first organic layer 291. The pre-organic layer may be patterned by a photolithography or the like to substantially simultaneously form the first color filter layer 222, the second-first organic layer 292a and the second-second organic layer 292b as respective organic patterns of a same material layer (e.g., in a same layer).

Figure 12:
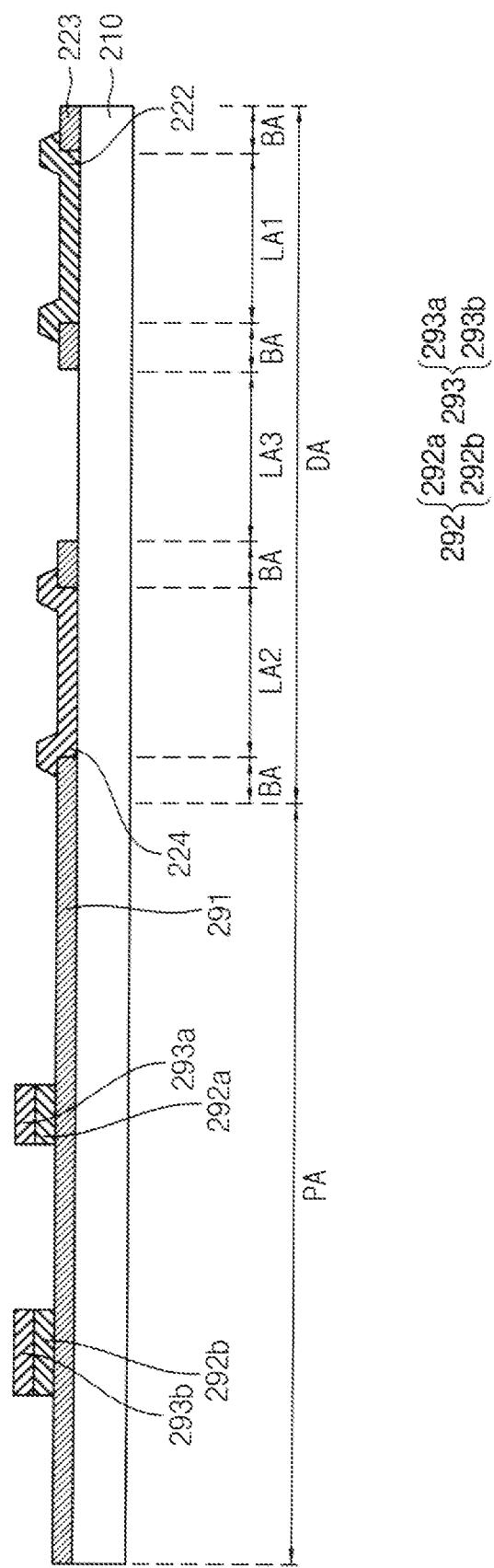

Referring to FIG. 12, the second color filter layer 224, the third-first organic layer 293a and the third-second organic layer 293b may be provided or formed on the upper substrate 210. The second color filter layer 224 may be provided or formed in the display area DA on the upper substrate 210. The second color filter layer 224 may be provided or formed to overlap the second light emitting area LA2 in the display area DA. In an embodiment, for example, the second color filter layer 224 may include or be formed of an organic material including a pigment having the second color. In an embodiment, for example, the second color may be red.

The third-first organic layer 293a may be provided or formed on the second-first organic layer 292a. In an embodiment, for example, the third-first organic layer 293a may be provided or formed to have substantially the same width (e.g., width in left and right directions) as the second-first organic layer 292a. The third-second organic layer 293b may be provided or formed on the second-second organic layer 292b. In an embodiment, for example, the third-second organic layer 293b may be provided or formed to have substantially the same width (e.g., width in left and right directions) as the second-second organic layer 292b. In an embodiment, for example, the third-first organic layer 293a and the third-second organic layer 293b may be formed of an organic material including a pigment having the second color.

In an embodiment, the second color filter layer 224, the third-first organic layer 293a and the third-second organic layer 293b may be substantially simultaneously (or concurrently) provided or formed. In an embodiment, for example, a pre-organic layer may be provided or formed of an organic material including a pigment having the second color on the upper substrate 210, the first organic layer 291, the second-first organic layer 292a and the second-second organic layer 292b. The pre-organic layer may be patterned by a photolithography or the like to substantially simultaneously form the second color filter layer 224, the third-first organic layer 293a and the third-second organic layer 293b as respective organic patterns of a same material layer (e.g., in a same layer).

Figure 13:
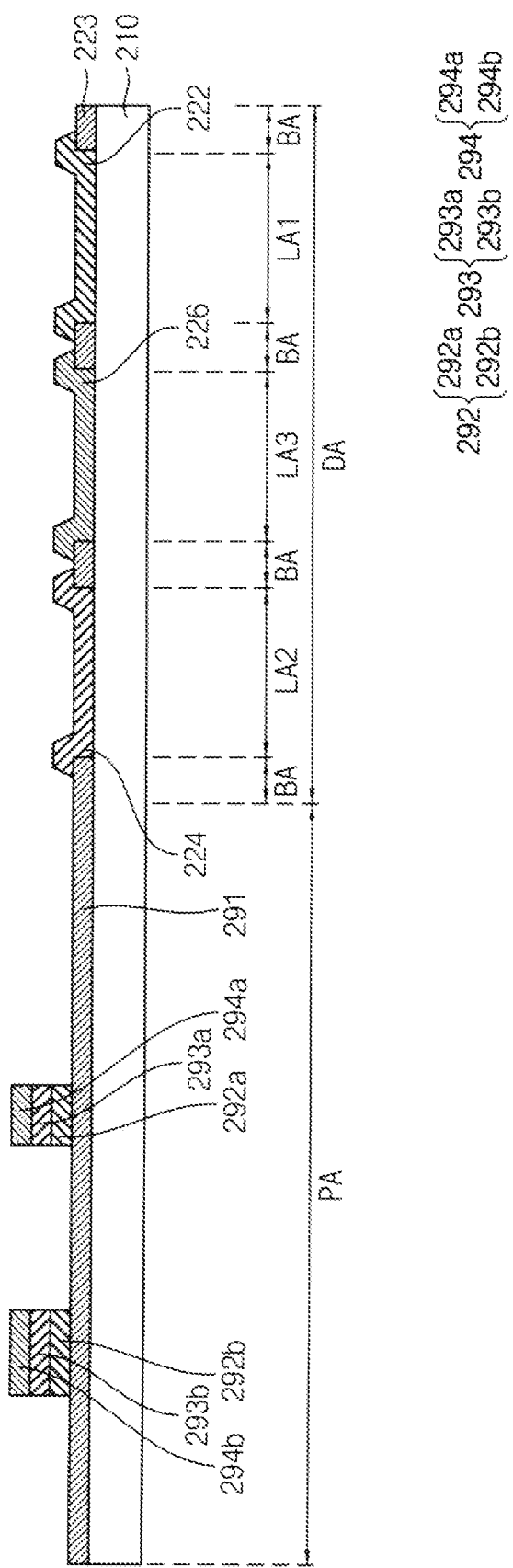

Referring to FIG. 13, the third color filter layer 226, the fourth-first organic layer 294a and the fourth-second organic layer 294b may be provided or formed on the upper substrate 210. The third color filter layer 226 may be provided or formed in the display area DA on the upper substrate 210. The third color filter layer 226 may be provided or formed to overlap the third light emitting area LA3 in the display area DA. In an embodiment, for example, the third color filter layer 226 may include or be formed of an organic material including a pigment having the third color. In an embodiment, for example, the second color may be green.

The fourth-first organic layer 294a may be provided or formed on the third-first organic layer 293a. In an embodiment, for example, the fourth-first organic layer 294a may be provided or formed to have substantially the same width (e.g., width in left and right directions) as the third-first organic layer 293a. The fourth-second organic layer 294b may be provided or formed on the third-second organic layer 293b. In an embodiment, for example, the fourth-second organic layer 294b may be provided or formed to have substantially the same width (e.g., width in left and right directions) as the third-second organic layer 293b. In an embodiment, for example, the fourth-first organic layer 294a and the fourth-second organic layer 294b may include or be formed of an organic material including a pigment having the third color.

In an embodiment, the third color filter layer 226, the fourth-first organic layer 294a and the fourth-second organic layer 294b may be substantially simultaneously (or concurrently) provided or formed. In an embodiment, for example, a pre-organic layer may include or be formed of an organic material including a pigment having the third color on the upper substrate 210, the first organic layer 291, the third-first organic layer 293a and the third-second organic layer 293b. The pre-organic layer may be patterned by a photolithography or the like to substantially simultaneously form the third color filter layer 226, the fourth-first organic layer 294a and the fourth-second organic layer 294b as respective organic patterns of a same material layer (e.g., in a same layer).

Figure 14:
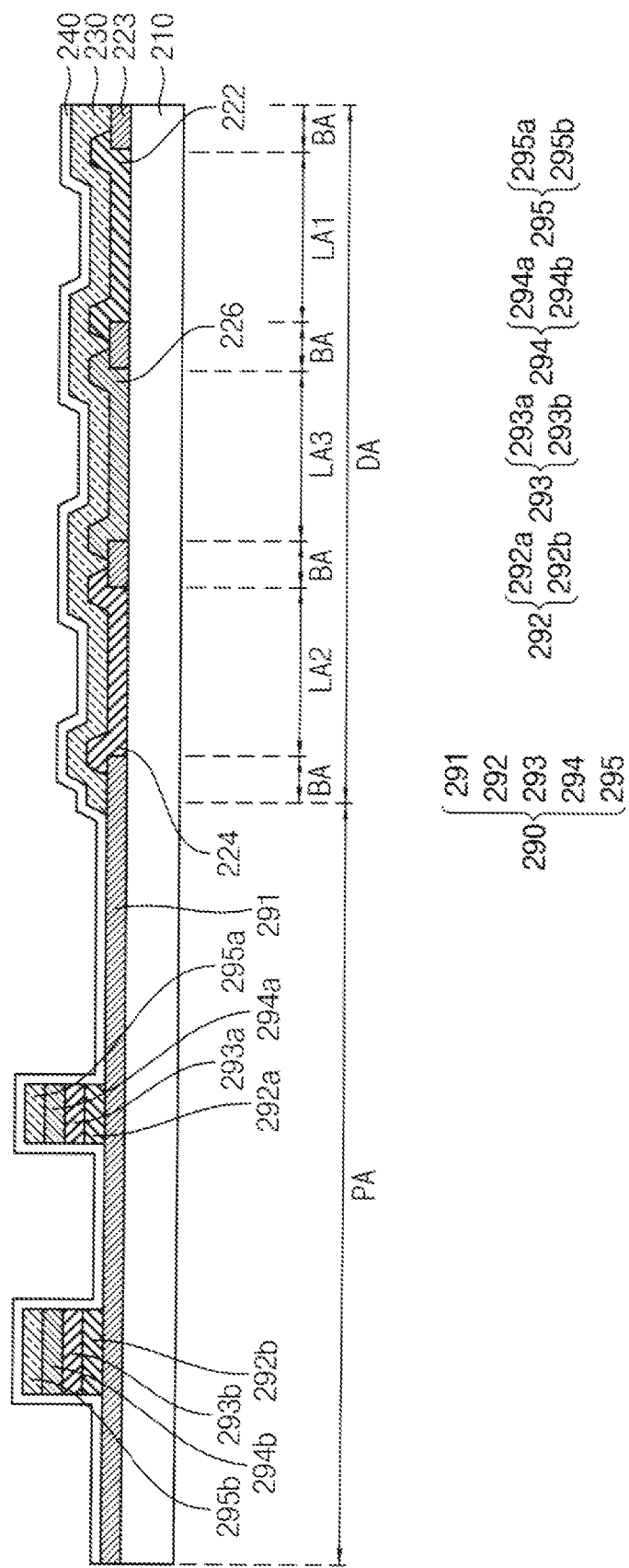

Referring to FIG. 14, the low refractive layer 230, the fifth-first organic layer 295a and the fifth-second organic layer 295b may be provided or formed on the upper substrate 210. The low refractive layer 230 may be provided or formed in the display area DA on the upper substrate 210. The low refractive layer 230 may be provided or formed in the display area DA on the first to third color filter layers 222, 224 and 226 and the light blocking layer 223. In an embodiment, for example, the low refractive layer 230 may include or be formed of an organic material having a relatively low refractive index such as acryl, polyimide, polyamide and/or the like.

The fifth-first organic layer 295a may be provided or formed on the fourth-first organic layer 294a. In an embodiment, for example, the fifth-first organic layer 295a may be provided or formed to have substantially the same width (e.g., width in left and right directions) as the fourth-first organic layer 294a. The fifth-second organic layer 295b may be provided or formed on the fourth-second organic layer 294b. In an embodiment, for example, the fifth-second organic layer 295b may be provided or formed to have substantially the same width (e.g., width in left and right directions) as the fourth-second organic layer 294b. In an embodiment, for example, the fifth-first organic layer 295a and the fifth-second organic layer 295b may include or be formed of an organic material such as acryl, polyimide, polyamide, and/or the like.

In an embodiment, the low refractive layer 230, the fifth-first organic layer 295a and the fifth-second organic layer 295b may be substantially simultaneously (or concurrently) provided or formed. In an embodiment, for example, a pre-organic layer may be provided or formed of an organic material such as acryl, polyimide, polyamide and/or the like on the first to third color filter layers 222, 224 and 226, the light blocking layer 223, the first organic layer 291, the fourth-first organic layer 294a and the fourth-second organic layer 294b. The pre-organic layer may be patterned by a photolithography or the like to substantially simultaneously form the low refractive layer 230, the fifth-first organic layer 295a and the fifth-second organic layer 295b as respective organic patterns of a same material layer (e.g., in a same layer).

The first passivation layer 240 may be provided or formed on the upper substrate 210. In an embodiment, for example, the first passivation layer 240 may be formed in an entirety of the display area DA and an entirety of the peripheral area PA on the upper substrate 210. In an embodiment, for example, the first passivation layer 240 may cover the low refractive layer 230 and the organic layer 290. The first passivation layer 240 may include or be formed of an inorganic insulating material such as silicon oxide, silicon nitride, silicon oxynitride, and/or the like.

Figure 15:
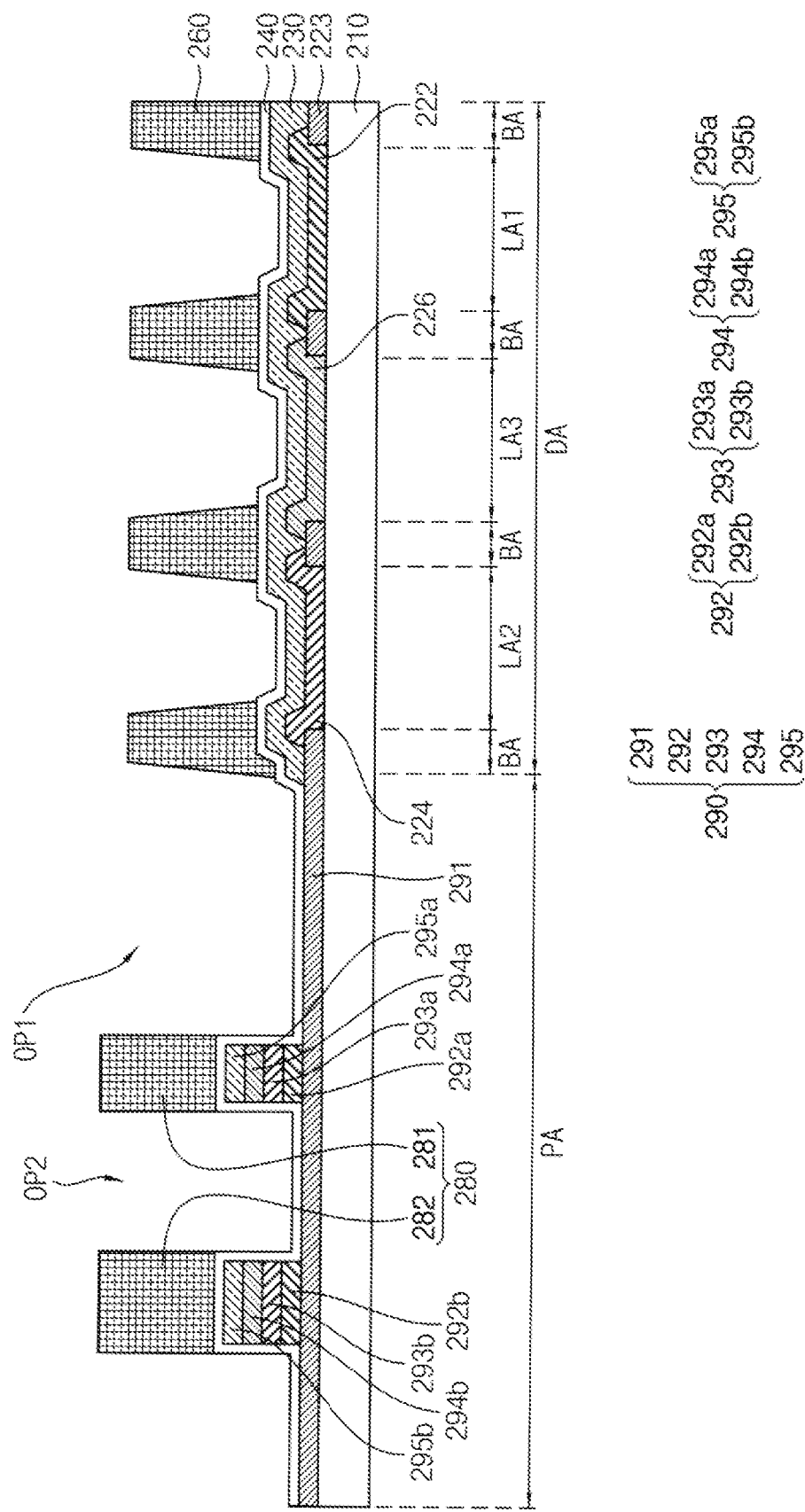

Referring to FIG. 15, the partition wall 260, the first upper dam 281 and the second upper dam 282 may be provided or formed on the first passivation layer 240. The partition wall 260 may be provided or formed in the display area DA on the first passivation layer 240. The partition wall 260 may be provided or formed to overlap the light blocking area BA in the display area DA. Accordingly, a plurality of openings may be defined or formed by portions of the partition wall 260. The plurality of openings may expose corresponding ones of the first to third light emitting areas LA1, LA2 and LA3, respectively. In an embodiment, for example, the partition wall 260 may include an organic material and a light blocking material.

The first upper dam 281 may be provided or formed to overlap the second-first organic layer 292a, the third-first organic layer 293a, the fourth-first organic layer 294a and the fifth-first organic layer 295a on the first passivation layer 240. In an embodiment, for example, the first upper dam 281 may be provided or formed to be spaced apart from the partition wall 260 and/or to surround the partition wall 260. Accordingly, the first opening OP1 may be defined or formed between the first upper dam 281 and the partition wall 260. In an embodiment, for example, the first upper dam 281 may include an organic material and/or a light blocking material.

The second upper dam 282 may be provided or formed to overlap the second-second organic layer 292b, the third-second organic layer 293b, the fourth-second organic layer 294b and the fifth-second organic layer 295b on the first passivation layer 240. In an embodiment, for example, the second upper dam 282 may be provided or formed to be spaced apart from the first upper dam 281 and/or to surround the first upper dam 281. Accordingly, the second opening OP2 may be defined or formed between the first upper dam 281 and the second upper dam 282. In an embodiment, for example, the second upper dam 282 may include an organic material and/or a light blocking material.

In an embodiment, the partition wall 260, the first upper dam 281 and the second upper dam 282 may be substantially simultaneously (or concurrently) provided or formed. In an embodiment, for example, a pre-organic layer may be provided or formed of an organic material and a light blocking material on the first passivation layer 240. The pre-organic layer may be patterned by a photolithography or the like to substantially simultaneously form the partition wall 260, the first upper dam 281 and the second upper dam 282 as respective patterns of a same material layer (e.g., in a same layer).

Figure 16:
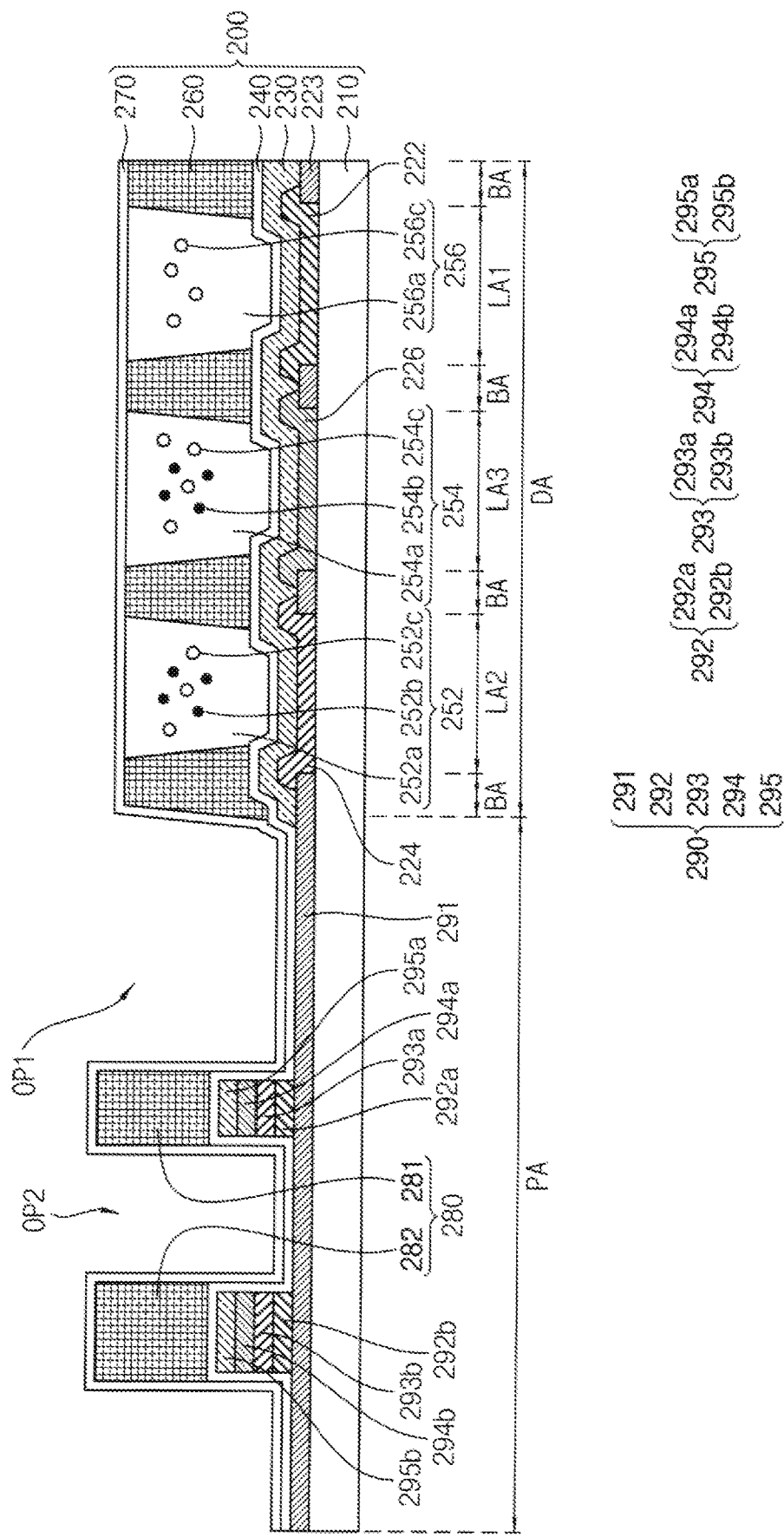

Referring to FIG. 16, the transmission part 256, the first color conversion part 252 and the second color conversion part 254 may be provided or formed in the display area DA on the upper substrate 210. In an embodiment, for example, the transmission part 256, the first color conversion part 252 and the second color conversion part 254 may be provided or formed to overlap the first to third light emitting area LA1, LA2 and LA3, respectively. The transmission part 256, the first color conversion part 252 and the second color conversion part 254 may be provided or formed in corresponding ones of the plurality of openings defined or formed in the partition wall 260.

In an embodiment, the transmission part 256, the first color conversion part 252 and the second color conversion part 254 may be provided or formed by an inkjet process. In an embodiment, for example, an ink including corresponding composition (e.g., corresponding wavelength-converting particles) may be provided in the plurality of openings provided or formed in the partition wall 260. An inkjet printing apparatus may be used to provide the ink. The inkjet printing apparatus may provide the ink inside the plurality of openings through a plurality of nozzles, respectively. Accordingly, the plurality of openings may be filled with the corresponding composition. The compositions in the plurality of openings may be cured to form the transmission part 256, the first color conversion part 252 and the second color conversion part 254. In an embodiment, for example, the compositions may be cured by heat and/or light.

The second passivation layer 270 may be provided or formed on the upper substrate 210 so that the upper panel 200 may be provided or formed. In an embodiment, for example, the second passivation layer 270 may be provided or formed in an entirety of the display area DA and an entirety of the peripheral area PA, on the upper substrate 210. In an embodiment, for example, the second passivation layer 270 may cover the partition wall 260, the first color conversion part 252, the second color conversion part 254, the transmission part 256, the first upper dam 281 and the second upper dam 282. That is, the second passivation layer 270 may be common to each of the partition wall 260, the first color conversion part 252, the second color conversion part 254, the transmission part 256, the first upper dam 281 and the second upper dam 282. The second passivation layer 270 may include or be formed of an inorganic insulating material such as silicon oxide, silicon nitride, silicon oxynitride and/or the like.

Figure 17:
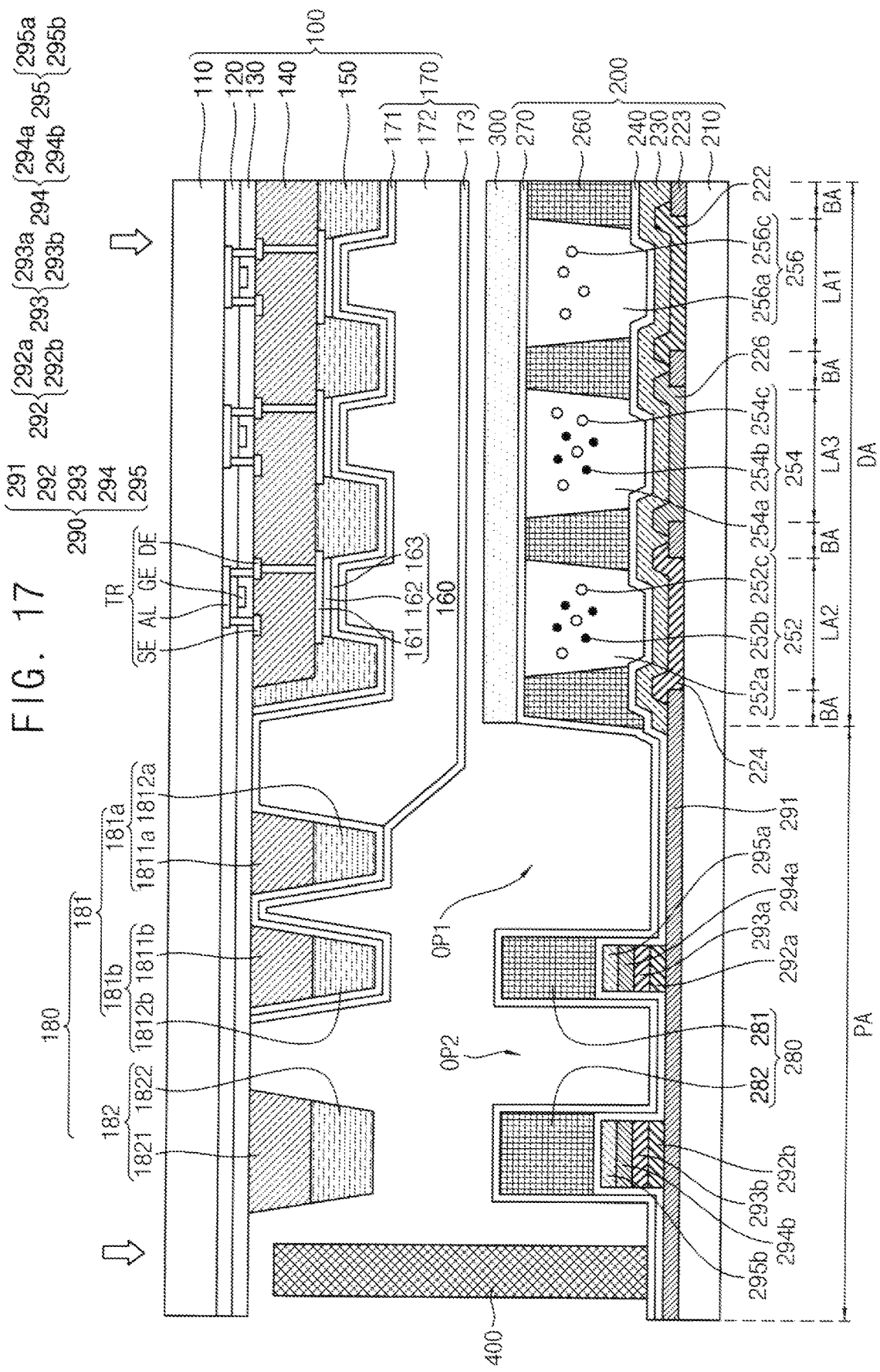
Figure 18:
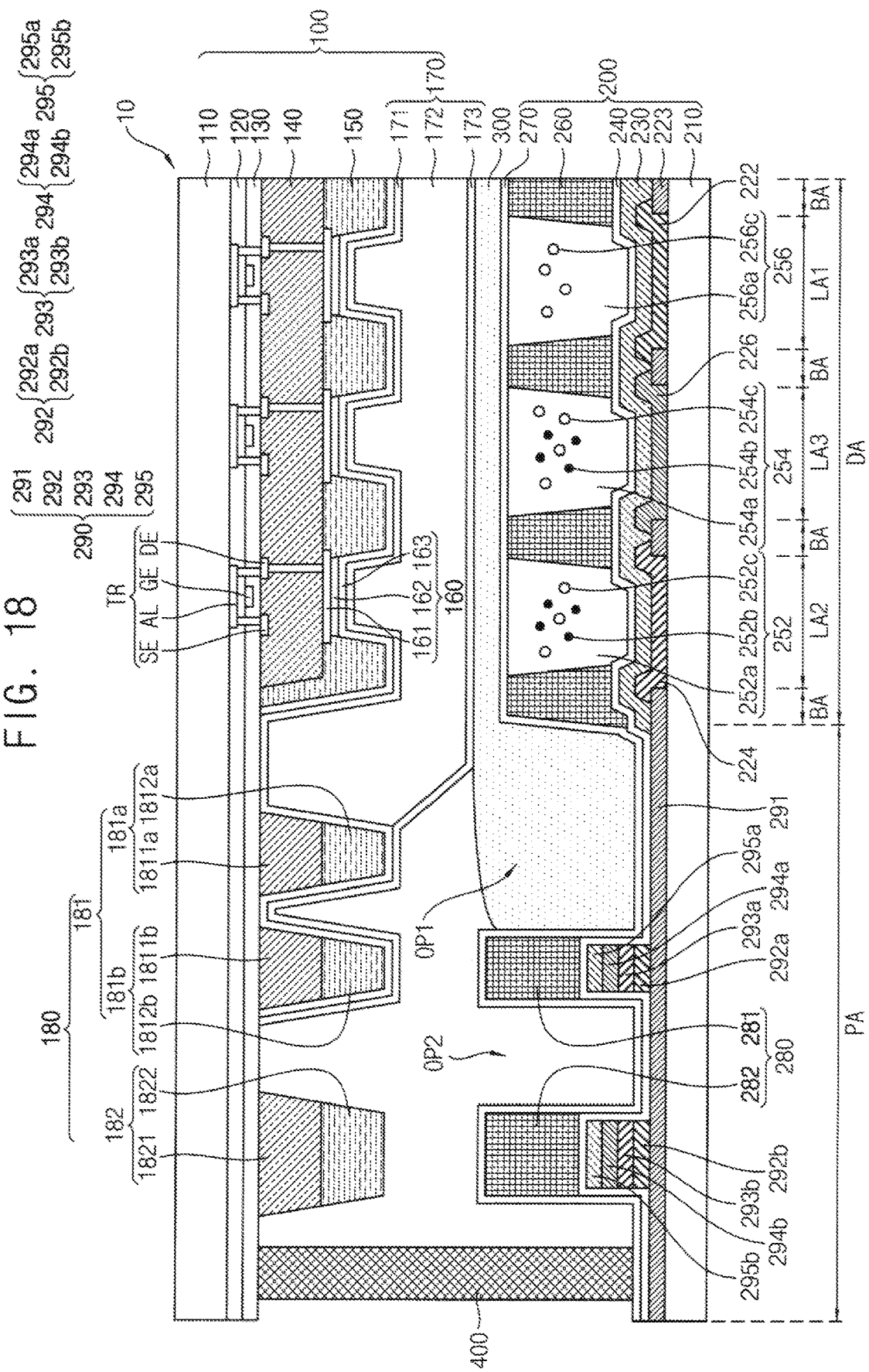

Referring to FIGS. 17 and 18, the filling member 300 and the sealing member 400 may be applied on the upper panel 200. In an embodiment, for example, the filling member 300 may be applied to the display area DA, on the second passivation layer 270. The sealing member 400 may be applied to the peripheral area PA, on the second passivation layer 270.

The lower panel 100 including a plurality of pixels may be disposed facing the upper panel 200. The upper panel 200 and the lower panel 100 which face each other may be combined with each other by the sealing member 400. In an embodiment, for example, a material of the sealing member 400 may be cured by heat and/or light.

When the upper panel 200 and the lower panel 100 are combined with each other, the filling member 300 may be compressed so that a portion of the filling member 300 may extend from the display area DA and flow into the peripheral area PA. In embodiments, the portion of the filling member 300 (e.g., extended portion) may be accommodated in the first opening OP1. That is, the first upper dam 281 may prevent or reduce overflowing of the filling member 300 to outside of the first upper dam 281 (e.g., to the left side of the first upper dam 281 of FIG. 18). In embodiments, the portion of the filling member 300 may be accommodated in the first and second openings OP1 and OP2. That is, even if the filling member 300 overflows to the outside of the first upper dam 281, the second upper dam 282 may prevent or reduce overflowing of the filling member 300 to outside of the second upper dam 282 (e.g., to the left side of the second upper dam 282 of FIG. 18). Accordingly, even if the amount of the filling member 300 applied to the upper panel 200 or the degree of compression of the filling member 300 varies, the width (e.g., the width in left and right directions) of the extended portion of the filling member 300 in the peripheral area PA may be easily controlled by the first and second upper dams 281 and 282. Accordingly, the reliability of the display device 10 may be improved.

Although embodiments and implementations have been described herein, other embodiments and modifications will be apparent from this description. Accordingly, the invention is not limited to such embodiments, but rather to the broader scope of the appended claims and various obvious modifications and equivalent arrangements as would be apparent to a person of ordinary skill in the art.

What is claimed is:

1. A display device comprising:
   a lower panel including a display area and a peripheral area which is adjacent to the display area;

an upper panel facing the lower panel, the upper panel including:
- color filter layers corresponding to the display area; and
- a material layer on the color filter layers, the material layer defining:
  - a partition wall defining a plurality of openings in the display area;
  - a first upper dam in the peripheral area and spaced apart from the partition wall; and
  - a first opening which is in the peripheral area and between the partition wall and the first upper dam; and
- a filling member which is in the display area between the lower panel and the partition wall of the upper panel and extends from the display area and into the first opening which is in the peripheral area.

2. The display device of claim 1, wherein the upper panel further includes color conversion parts in the plurality of openings of the partition wall, respectively.

3. The display device of claim 1, wherein the first upper dam which is spaced apart from the partition wall surrounds the partition wall.

4. The display device of claim 1, wherein the partition wall includes an organic material.

5. The display device of claim 1, wherein the upper panel further includes a first passivation layer in the display area and extending from the display area into the peripheral area to cover the partition wall and the first upper dam, the first passivation layer including an inorganic material.

6. The display device of claim 1, wherein the upper panel further includes:
- an upper substrate facing the partition wall in the display area and the first upper dam in the peripheral area; and
- in the peripheral area, an organic layer between the upper substrate and the first upper dam.

7. The display device of claim 6, wherein the organic layer extends from between the upper substrate and the first upper dam and overlaps the first opening defined between the partition wall and the first upper dam.

8. The display device of claim 6, wherein the organic layer is spaced apart from the first opening defined between the partition wall and the first upper dam in a plan view.

9. The display device of claim 6, wherein the upper panel further includes:
- the color filter layers in the display area and between the upper substrate and the partition wall, and
- the organic layer in a same layer of the upper panel as at least one of the color filter layers.

10. The display device of claim 9, wherein the upper panel further includes: a second passivation layer which is between the partition wall and the color filter layers in the display area and between the first upper dam and the organic layer in the peripheral area, the second passivation layer including an inorganic material.

11. The display device of claim 6, wherein the upper panel further includes:
- a light blocking layer between the upper substrate and the partition wall in the display area, and
- the organic layer in a same layer of the upper panel as the light blocking layer.

12. The display device of claim 6, wherein the upper panel further includes:
- color conversion parts in the plurality of openings of the partition wall, respectively, and having a refractive index;
- a low refractive layer between the upper substrate and the color conversion parts and having a refractive index, the refractive index of the low refractive layer smaller than the refractive index of the color conversion parts; and
- the organic layer in a same layer of the upper panel as the low refractive layer.

13. The display device of claim 6, wherein the organic layer which is between the upper substrate and the first upper dam of the upper panel includes a plurality of layers including different materials.

14. The display device of claim 13, wherein within the organic layer, at least one of the plurality of layers overlaps the first opening, and
at least one of the plurality of layers is spaced apart from the first opening defined between the partition wall and the first upper dam in a plan view.

15. The display device of claim 1, wherein the lower panel further includes a first lower dam in the peripheral area and corresponding to the first upper dam of the upper panel.

16. The display device of claim 15, wherein
the upper panel faces the lower panel along a thickness direction, and
the first upper dam which corresponds to the first lower dam is spaced apart from the first lower dam along the thickness direction.

17. The display device of claim 15, wherein the lower panel further includes:
a second lower dam in the peripheral area and spaced apart from the first lower dam, and
the first lower dam between the second lower dam and the display area.

18. The display device of claim 17, wherein the first upper dam of the upper panel corresponds to both the first lower dam and the second lower dam of the lower panel.

19. The display device of claim 17, wherein the upper panel further includes:
a second upper dam spaced apart from the first upper dam and corresponding to the second lower dam of the lower panel, and
a second opening defined between the first upper dam and the second upper dam.

20. The display device of claim 19, wherein the second upper dam which is spaced apart from the first upper dam surrounds the first upper dam.

21. The display device of claim 19, wherein the filling member extends from the display area and into the second opening defined between the first upper dam and the second upper dam.

22. The display device of claim 19, wherein the upper panel further includes:
an upper substrate facing each of the partition wall in the display area and the second upper dam in the peripheral area; and
in the peripheral area, an organic layer between the upper substrate and the second upper dam.

23. The display device of claim 22, wherein the organic layer extends from between the upper substrate and the second upper dam and overlaps each of the first upper dam, the first opening and the second opening.

24. The display device of claim 22, wherein the organic layer is spaced apart from the second opening defined between the first upper dam and the second upper dam in a plan view.

25. The display device of claim 15, the lower panel further includes:
a driving element in the display area;
a light emitting element which is connected to the driving element and includes a pixel electrode, a counter electrode facing the pixel electrode, and an emission layer between the pixel electrode and the counter electrode;

a planarization layer between the driving element and the light emitting element and including an organic material;

a pixel defining layer between the planarization layer and the counter electrode and including an organic material; and the first lower dam including:

a first layer in a same layer of the lower panel as the planarization layer; and a second layer facing the first layer and in a same layer of the lower panel as the pixel defining layer.

26. The display device of claim 1, further comprising a sealing member which is in the peripheral area and combines the upper panel and the lower panel to each other.

27. The display device of claim 26, wherein the sealing member is spaced apart from the partition wall of the upper panel with the first upper dam of the upper panel therebetween.

* * * * *